US011231472B2

(12) United States Patent
Berendt, Jr. et al.

(10) Patent No.: US 11,231,472 B2
(45) Date of Patent: Jan. 25, 2022

(54) ADAPTIVE COIL BASE

(71) Applicant: Quality Electrodynamics, LLC, Mayfield Village, OH (US)

(72) Inventors: David Michael Berendt, Jr., Aurora, OH (US); Michael Joseph Wyban, Chardon, OH (US); John Thomas Carlon, Perry, OH (US)

(73) Assignee: Quality Electrodynamics, LLC, Mayfield Village, OH (US)

( * ) Notice: Subject to any disclaimer, the term of this patent is extended or adjusted under 35 U.S.C. 154(b) by 0 days.

(21) Appl. No.: 17/012,873

(22) Filed: Sep. 4, 2020

(65) Prior Publication Data

US 2021/0072330 A1 Mar. 11, 2021

Related U.S. Application Data

(60) Provisional application No. 62/896,733, filed on Sep. 6, 2019.

(51) Int. Cl.
*G01R 33/34* (2006.01)
*G01R 33/341* (2006.01)
*G01R 33/30* (2006.01)
*G01R 33/36* (2006.01)

(52) U.S. Cl.
CPC ....... *G01R 33/34007* (2013.01); *G01R 33/30* (2013.01); *G01R 33/341* (2013.01); *G01R 33/3642* (2013.01)

(58) Field of Classification Search
CPC G01R 33/34007; G01R 33/341; G01R 33/30; G01R 33/3642
See application file for complete search history.

(56) References Cited

U.S. PATENT DOCUMENTS

| | | | |
|---|---|---|---|
| 5,085,219 A | * | 2/1992 | Ortendahl ............ G01R 33/341 324/318 |
| 5,178,146 A | | 1/1993 | Giese |
| 5,197,474 A | | 3/1993 | Englund et al. |
| 7,489,133 B1 | | 2/2009 | Keidl et al. |
| 7,693,570 B2 | | 4/2010 | Green et al. |
| 8,805,477 B2 | | 8/2014 | Biber et al. |

* cited by examiner

*Primary Examiner* — G. M. A Hyder
(74) *Attorney, Agent, or Firm* — Eschweiler & Potashnik, LLC

(57) ABSTRACT

A system for positioning of an RF surface coil to several imaging tables has a table coupling device with first and second sides and table engagement features. The first side has a planar surface to mate with a first imaging table. The second side has a contoured surface having a curvature to mate with a second imaging table. A coil coupling device selectively couples to each of the first and second sides of the table coupling device in respective first and second configurations. The coil coupling device selectively rotates about a rotation axis perpendicular to the first side, and selectively translates along a translation axis perpendicular to the rotation axis. The coil coupling device has one or more coil engagement features to selectively engage the RF surface coil in each of a horizontal position and vertical position of the RF surface coil with respect to the table coupling device.

20 Claims, 21 Drawing Sheets

ADAPTIVE COIL BASE

REFERENCE TO RELATED APPLICATIONS

This application claims the benefit of U.S. Provisional Application No. 62/896,733, filed on Sep. 6, 2019, the contents of which are incorporated herein by reference in their entirety.

TECHNICAL FIELD

The present disclosure relates generally to imaging systems, and more particularly, to a system, apparatus, and method for selectively coupling a coil to variously-configured patient tables of a magnetic resonance imaging system.

BACKGROUND

Magnetic resonance imaging (MRI) uses radio frequency (RF) antennas, in the form of coils, to transmit and receive radio frequency pulses within a magnetic field. The received pulses are used to create images of tissue to aid in the diagnosis of medical conditions. Typically, MRI systems incorporate a whole-body coil (WBC). The whole-body coil is meant for imaging large portions of the body, and therefore is not optimized for specific smaller anatomies. This leads to low or poor signal to noise ratio (SNR) when imaging specific smaller anatomy. Surface coils designed for specific smaller anatomy are used to increase SNR so the system can create better images. Coils are often designed and built by a different manufacturer than that of the MRI system.

There are several MRI system manufacturers, and each manufacturer may have several differing systems. Due to unique requirements for each system, such as bore size, each system may have its own unique MRI system patient table. MRI surface coils can be designed to be used on multiple different MRI systems, whereby the coil(s) mechanically interface to multiple MRI system patient tables and the table's unique designs. Different designs can be seen in systems by the same manufacturer, as well as from different manufacturers. Coils can also be used in varying orientations to aid in patient comfort and to optimize the coil for the MRI system bore size and image quality. One such example is a wrist coil being able to be in a horizontal orientation with the ability to rotate, allowing the patient to lie on their stomach, or to be in a vertical orientation, allowing the patient to lie on their back.

Existing systems accomplish coupling of coils to the MRI systems by either employing multiple bases and mounting solutions that are unique for the particular use, or allowing for an inability to positively locate the coil on the MRI system patient table during a scan. Adding the extra bases of existing systems employing them adds cost and complexity to the coil for the manufacturer by requiring a large capital investment for each base and higher part count. That complexity is also seen by the customer and end user, in that they have to store and train for multiple coil bases. To switch between orientations, the end user of existing systems may be required to dismount the coil from a first base, remove the first base, locate the required second base, place the required second base, and remount the coil. Thus, the coil workflow is made more complex by having multiple bases.

These bases are relegated to a single system because they only use one or two of their sides as keying surfaces and are used in one direction.

SUMMARY

The present disclosure provides various apparatuses, systems, and methods for selective operative coupling of one or more RF coils to one or more imaging tables in an MRI system. Accordingly, the following presents a simplified summary of the disclosure in order to provide a basic understanding of some aspects of the disclosure. This summary is not an extensive overview of the disclosure. It is intended to neither identify key or critical elements of the invention nor delineate the scope of the invention. Its purpose is to present some concepts of the invention in a simplified form as a prelude to the more detailed description that is presented later.

In accordance with one example of the present disclosure, a coil positioning system for selective positioning of an RF surface coil with respect to a plurality of imaging tables is provided. The coil positioning system, for example, comprises a table coupling device, wherein the table coupling device comprises a table coupling body having a first side and a second side generally opposite the first side, as well as a first interface device. One or more first table engagement features of the table coupling device are associated with the first side of the table coupling body, wherein the one or more first table engagement features are configured to selectively engage a first of the plurality of imaging tables in a first orientation of the table coupling device. One or more second table engagement features of the table coupling device are further associated with the second side of the table coupling body, wherein the one or more second table engagement features are configured to selectively engage a second of the plurality of imaging tables in a second orientation of the table coupling device.

The coil positioning system, for example, further comprises a coil coupling device, wherein the coil coupling device comprises a coil coupling body and a second interface device operatively coupled to the coil coupling body. The second interface device, for example, is configured to selectively engage the first interface device, thereby selectively coupling the coil coupling device to the table coupling device and fixing the coil coupling body in a selected one of a plurality of positions with respect to the table coupling device. One or more coil engagement features of the coil coupling device, for example, are operatively coupled to the coil coupling body and configured to selectively engage the RF surface coil in each of a horizontal position and a vertical position of the RF surface coil with respect to the coil coupling body, thereby selectively coupling the RF surface coil to the coil coupling device.

In accordance with one exemplified aspect, the first interface device comprises at least one rack gear fixedly coupled to the table coupling body, wherein the second interface device comprises an engagement mechanism and at least one arcuate gear. The engagement mechanism, for example, is configured to selectively engage the at least one arcuate gear with the at least one rack gear, thereby selectively fixing the coil coupling body in each selected one of the plurality of positions with respect to the table coupling device based, at least in part, on a position of the at least one arcuate gear with respect to the at least one rack.

At least a portion of the plurality of positions of the coil coupling body with respect to the table coupling device, for example, comprise a plurality of linear positions of the coil coupling body along a length of the table coupling device. In another example, at least a portion of the plurality of positions of the coil coupling body with respect to the table coupling device comprise a plurality of rotational positions of the coil coupling body with respect to the table coupling device. In yet another example, the plurality of positions of the coil coupling body with respect to the table coupling device comprise one or more of a plurality of linear positions of the coil coupling body along a length of the table coupling device and a plurality of rotational positions of the coil coupling body with respect to the table coupling device.

The engagement mechanism, for example, can comprise one or more buttons operatively coupled to one or more levers, wherein the one or more levers are operatively coupled to the coil coupling body and the at least one arcuate gear. The one or more buttons, for example, are configured to selectively engage the at least one arcuate gear with the at least one rack gear via the one or more levers, thereby selectively fixing the coil coupling body in each of the plurality of positions with respect to the table coupling device based, at least in part, on a depression of the one or more buttons.

In accordance with another exemplified aspect, the table coupling body is generally rectangular and defined by a length and a width when viewed from the first side, wherein the length is greater than the width. The one or more first table engagement features, for example, comprise one or more curved features associated with the first side of the table coupling body, wherein the one or more curved features are configured to mate with a curvature of the first of the plurality of imaging tables in the first orientation of the table coupling device. In yet another example, the one or more curved features of the table coupling body are generally located at one or more respective extents of the length of the table coupling body, wherein the first side of the table coupling body selectively engages the first of the plurality of imaging tables in the first orientation of the table coupling device. According to yet another example, the one or more second table engagement features comprise one or more of a step, key, pin, or groove associated with the second side of the table coupling body and are configured to selectively engage one or more imaging table features associated with the second of the plurality of imaging tables in the second orientation of the table coupling device.

In yet another exemplified aspect, the table coupling device further comprises one or more third table engagement features associated with the second side of the table coupling body. The one or more third table engagement features, for example, are configured to selectively engage a third of the plurality of imaging tables in a third orientation of the table coupling device, wherein the second orientation and the third orientation are rotated 90 degrees with respect to one another when viewed from the second side. The one or more second table engagement features and one or more third table engagement features, for example, can comprise one or more of a step, key, pin, or groove configured to selectively mate with one or more imaging table features of the second of the plurality of imaging tables and the third of the plurality of imaging tables.

In still another exemplified aspect, the one or more coil engagement features comprise a dynamic coil engagement member, wherein the dynamic coil engagement member is selectively positionable with respect to the coil coupling body and configured to selectively engage a first of a plurality of coil features of the RF surface coil. The one or more coil engagement features, for example, further comprise a static coil engagement member that is fixed with respect to the coil coupling body and configured to selectively engage a second of the plurality of coil features of the RF surface coil. The dynamic coil engagement member, for example, comprises a coil engagement lever that is biased with respect to the coil coupling body and configured to selectively engage the first of the plurality of coil features of the RF surface coil, wherein the static coil engagement member comprises one or more of a slot, groove, tab, or ridge associated with the coil coupling body.

According to a still further exemplified aspect, the coil coupling device can comprise an articulated engagement member. The articulated engagement member, for example, is rotatably coupled to the coil coupling body along a coil coupling axis, wherein the one or more coil engagement features are integral to the articulated engagement member, and wherein the horizontal position and vertical position of the RF surface coil with respect to the coil coupling body is determined based on a rotational position of the articulated engagement member about the coil coupling axis. The one or more coil engagement features, for example, can comprise one or more snap-fit coupling members configured to selectively engage one or more coil features of the RF surface coil.

In accordance with another aspect of the disclosure, a system for selective positioning of an RF surface coil with respect to a plurality of imaging tables is provided, wherein the system comprises a table coupling device having a first side, a second side, and a plurality of table engagement features. The first side and second side generally oppose one another, wherein the first side is defined by a generally planar surface configured to generally mate with a first of the plurality of imaging tables, and wherein the second side is defined by a contoured surface having a curvature associated therewith configured to mate with a second of the plurality of imaging tables. The system further comprises a coil coupling device configured to selectively couple each of the first side and second side of the table coupling device in a respective first configuration and second configuration. As such, the coil coupling device is configured to selectively rotate about a rotation axis extending generally perpendicularly to the first side, wherein the coil coupling device is further configured to selectively translate along a translation axis extending generally perpendicularly to the rotation axis. The coil coupling device also comprises one or more coil engagement features configured to selectively engage the RF surface coil in each of a horizontal position and a vertical position of the RF surface coil with respect to the table coupling device.

In another example, the table coupling device comprises at least one rack gear, and wherein the coil coupling device comprises an engagement mechanism and at least one arcuate gear. The engagement mechanism is configured to selectively engage the at least one arcuate gear with the at least one rack gear, thereby selectively fixing the coil coupling device in each of a selected one of a plurality of positions with respect to the table coupling device based, at least in part, on a position of the at least one arcuate gear with respect to the at least one rack. The one or more coil engagement features, for example, comprise a dynamic coil engagement member, wherein the dynamic coil engagement member is selectively positionable and configured to selectively engage one or more coil features of the RF surface coil.

In accordance with a further aspect of the disclosure, an example method is provided for selectively positioning an RF surface coil with respect to a plurality of imaging tables. The method comprises providing a table coupling device comprising a first side, a second side, and a plurality of table engagement features, wherein the first side and second side generally oppose one another, wherein the first side is defined by a generally planar surface, and wherein the second side is defined by a contoured surface having a curvature associated therewith. A desired one of the plurality of imaging tables is selected for a desired mounting of the table coupling device thereto. An orientation of a table coupling device with respect to the desired one of the plurality of imaging tables determined, wherein the determination of the orientation of the table coupling device is based on a configuration of the desired one of the plurality of imaging tables, and wherein the orientation comprises one of the first side or second side facing the desired one of the plurality of imaging tables.

The one of the first side or second side of the table coupling device is operatively coupled to the desired one of the plurality of imaging tables in the determined orientation of the table coupling device, and a desired one of a plurality of positions of the RF surface coil with respect to the desired one of the plurality of imaging tables is selected. The plurality of positions, for example, comprise one or more of a horizontal, vertical, rotational, and linear position of the RF surface coil with respect to the desired one of the plurality of imaging tables. Further, the RF surface coil is operatively coupled to the coil coupling device in the desired one of the plurality of positions.

The above summary is merely intended to give a brief overview of some features of some embodiments of the present invention, and other embodiments may comprise additional and/or different features than the ones mentioned above. In particular, this summary is not to be construed to be limiting the scope of the present application. Thus, to the accomplishment of the foregoing and related ends, the invention comprises the features hereinafter described and particularly pointed out in the claims. The following description and the annexed drawings set forth in detail certain illustrative embodiments of the invention. These embodiments are indicative, however, of a few of the various ways in which the principles of the invention may be employed. Other objects, advantages and novel features of the invention will become apparent from the following detailed description of the invention when considered in conjunction with the drawings.

DETAILED DESCRIPTION

Figure 1:
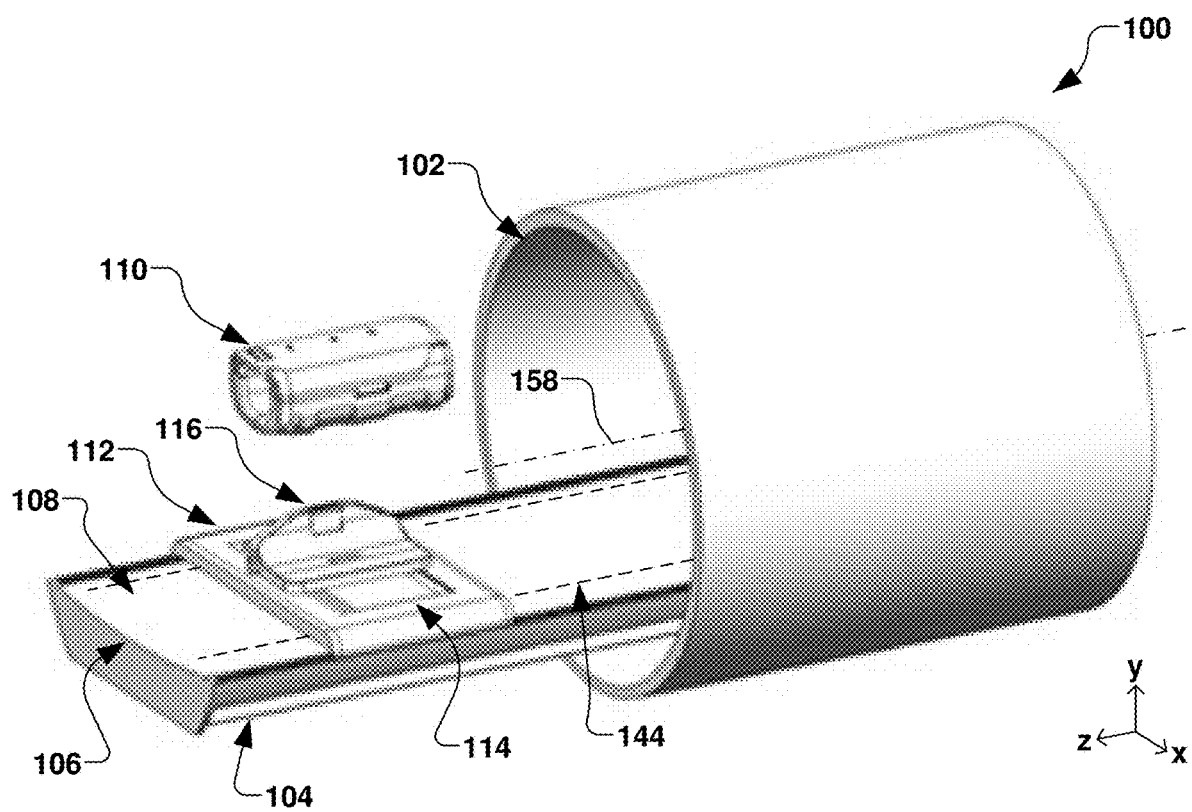
FIG. 1 illustrates a perspective view of an MRI system incorporating a coil positioning system in accordance with an example of the present disclosure.

The present disclosure provides systems, apparatuses and methods for selectively coupling an RF coil in a plurality of positions to variously-configured patient tables of an MRI system in order to support a variety of diagnostic scanning applications. Multiple example embodiments provided herein can provide numerous advantages over existing systems, such as improving patient comfort and facilitating a simplified workflow for the end user (e.g., an MRI operator).

Accordingly, the present invention will now be described with reference to the drawings, wherein like reference numerals may be used to refer to like elements throughout. It is to be understood that the description of these aspects are merely illustrative and that they should not be interpreted in a limiting sense. In the following description, for purposes of explanation, numerous specific details are set forth in order to provide a thorough understanding of the present invention. It will be evident to one skilled in the art, however, that the present invention may be practiced without these specific details. Further, the scope of the invention is not intended to be limited by the embodiments or examples described hereinafter with reference to the accompanying drawings, but is intended to be only limited by the appended claims and equivalents thereof.

It is also noted that the drawings are provided to give an illustration of some aspects of embodiments of the present disclosure and therefore are to be regarded as schematic only. In particular, the elements shown in the drawings are not necessarily to scale with each other, and the placement of various elements in the drawings is chosen to provide a clear understanding of the respective embodiment and is not to be construed as necessarily being a representation of the actual relative locations of the various components in implementations according to an embodiment of the invention. Furthermore, the features of the various embodiments and examples described herein may be combined with each other unless specifically noted otherwise.

It is also to be understood that in the following description, any direct connection or coupling between functional blocks, devices, components, circuit elements or other physical or functional units shown in the drawings or described herein could also be implemented by an indirect connection or coupling. Furthermore, it is to be appreciated that functional blocks or units shown in the drawings may be implemented as separate features or circuits in one embodiment, and may also or alternatively be fully or partially implemented in a common feature or circuit in another embodiment. For example, several functional blocks may be implemented as software running on a common processor, such as a signal processor. It is further to be understood that any connection which is described as being wire-based in the following specification may also be implemented as a wireless communication, unless noted to the contrary. Aspects of the present disclosure are best understood from the following detailed description when read with the accompanying Figures. It is noted that, in accordance with the standard practice in the industry, various features are not drawn to scale. In fact, the dimensions of the various features may be arbitrarily increased or reduced for clarity of discussion.

Figure 2:
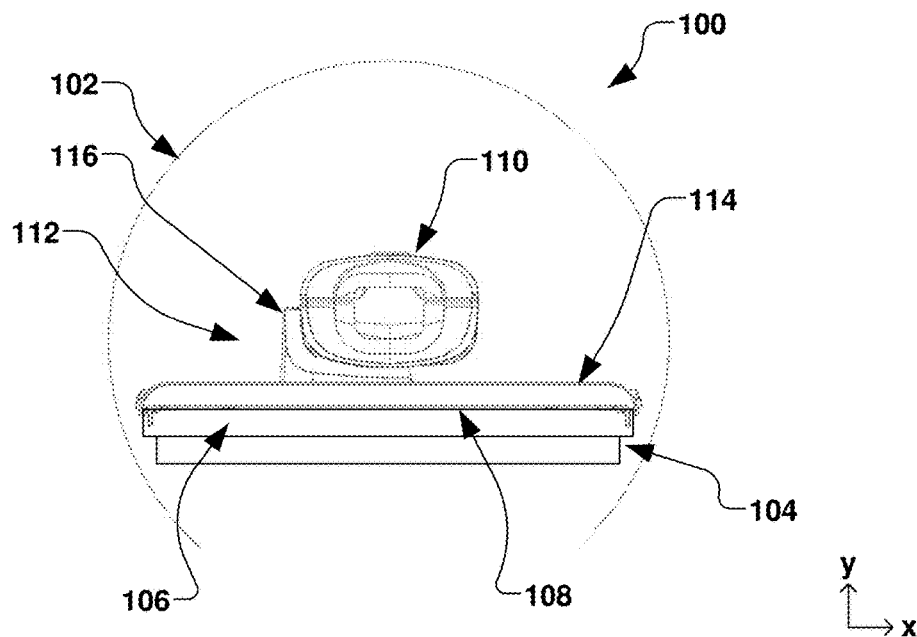
FIG. 2 is a front elevation view of an example MRI system incorporating a coil positioning system in accordance with an example of the present disclosure.

Referring generally to the Figures, FIGS. 1 and 2 illustrate an example of an MRI system 100 incorporating various example aspects of the present disclosure. The MRI system 100, for example, comprises a bore 102 and a patient handling apparatus 104 comprising an imaging table 106 (e.g., a patient table, etc.) configured to at least partially pass into and/or through the bore 102. The design of the patient handling apparatus 104, for example, can vary by manufacturer or particular specification(s) associated with the MRI system 100, whereby the imaging table 106 can take a plurality of forms, but in general, is configured to support a patient on a patient surface 108. In the example illustrated in FIG. 1, the patient surface 108 is contoured or curved, while in other examples, such as shown in FIG. 2, the patient surface is generally planar, as will be appreciated in various examples hereafter.

An RF surface coil 110 (also known as an RF coil), for example, can be further utilized in conjunction with the MRI system 100, wherein the RF coil is configured to provide greater imaging detail of a portion of the patient's body, such as a wrist, ankle, knee, etc., when passed through the bore 102. While the RF surface coil 110 is described through various examples herein, it is to be appreciated that the RF coil may take various other forms that will be known to one of ordinary skill in the art. The RF surface coil 110, for example, is a physically separate device from the imaging table 106 (e.g., as shown in FIG. 1), such that the RF coil can be selectively interchanged with other RF coils (not shown) for imaging of various portions of the patient's body when coupled to the imaging table (e.g., as shown in FIG. 2). The present disclosure provides for selective and accurate operative coupling between RF surface coils 110 and imaging tables 106 of varying styles via a universal coupling apparatus.

In general terms, the present disclosure advantageously provides various embodiments for selective coupling of the various RF coils 110 in various positions with respect to imaging tables 106 having various architectures. Various example embodiments are provided herein to attain these advantages. In one example, a coil positioning system 112 is provided, wherein the coil positioning system comprises a table coupling device 114 and a coil coupling device 116. The table coupling device 114, for example, is configured to operatively couple to the imaging table 106 in various orientations based, at least in part, on an architecture of the imaging table. The coil positioning system 112 further comprises a coil coupling device 116 configured to operatively couple to the table coupling device in a plurality of positions with respect to the table coupling device, while further being configured to selectively operatively couple the RF surface coil 110 thereto in a plurality of locations and/or orientations with respect to the imaging table. The coil positioning system 112 of the present disclosure advantageously provides for rotational and translational orientation of the RF surface coil 110 with respect to the imaging table 106 to be set and/or modified without tools.

Various components of the coil positioning system 112, for example, can be constructed of one or more rigid materials, such as polymers, metals, urethanes, foams, or any combination thereof, whereby the components (e.g., features of the table coupling device 114, the coil coupling device 116, etc.) are of sufficient strength and rigidity to support the weight thereof (e.g., including the RF surface coil), as well as at least a portion of a patient's weight undergoing imaging.

Figure 3A:
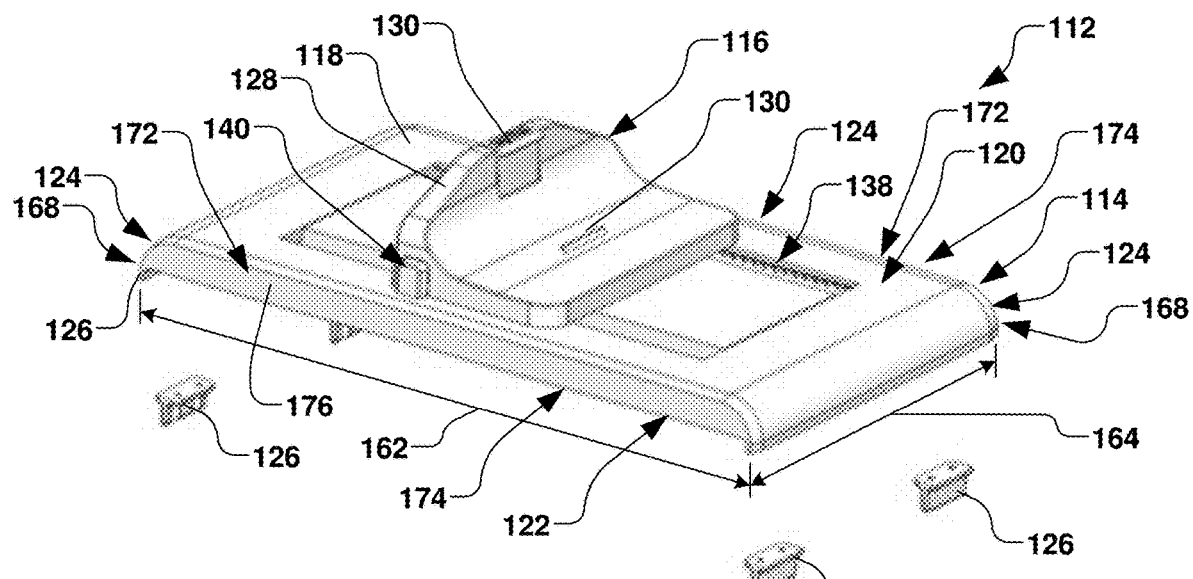
FIG. 3A is a perspective view of an example coil positioning system.
Figure 3B:
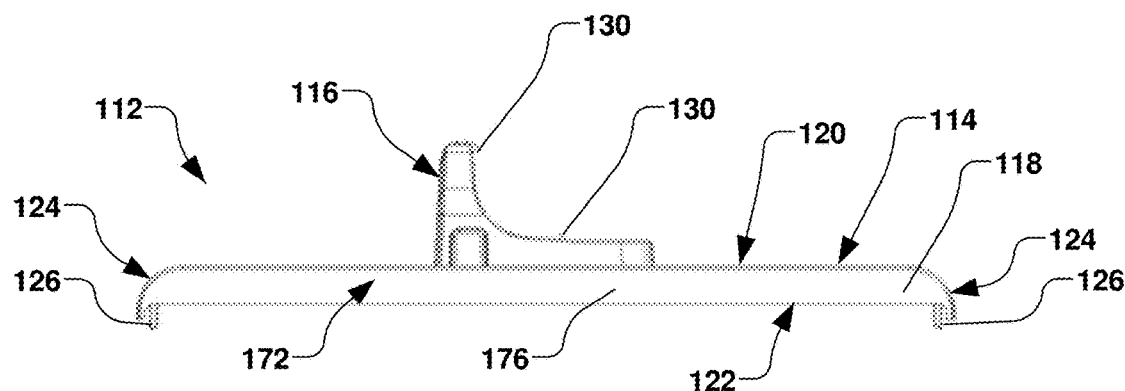
FIG. 3B is a front elevation view of the coil positioning system of FIG. 3A.
Figure 3C:
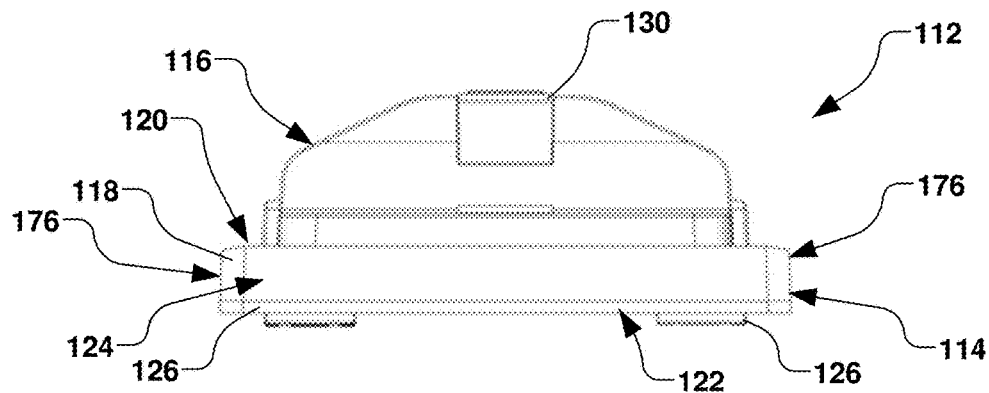
FIG. 3C is a side elevation view of the coil positioning system of FIG. 3A.

The present disclosure, for example, contemplates various configurations of the table coupling device 114. However, in general terms, as illustrated in FIGS. 3A-3C, the table coupling device 114 comprises a table coupling body 118 having a first side 120 and a second side 122, wherein the first side is generally opposite the second side. Further, the table coupling device 114 comprises one or more first table engagement features 124 associated with the first side 120 of the table coupling body 118, as well as one or more second table engagement features 126 associated with the second side 122 of the table coupling body 118. It is to be appreciated that one or more of the first table engagement features 124 may also operate as one or more second table engagement features 126, and vice-versa.

Figure 4A:
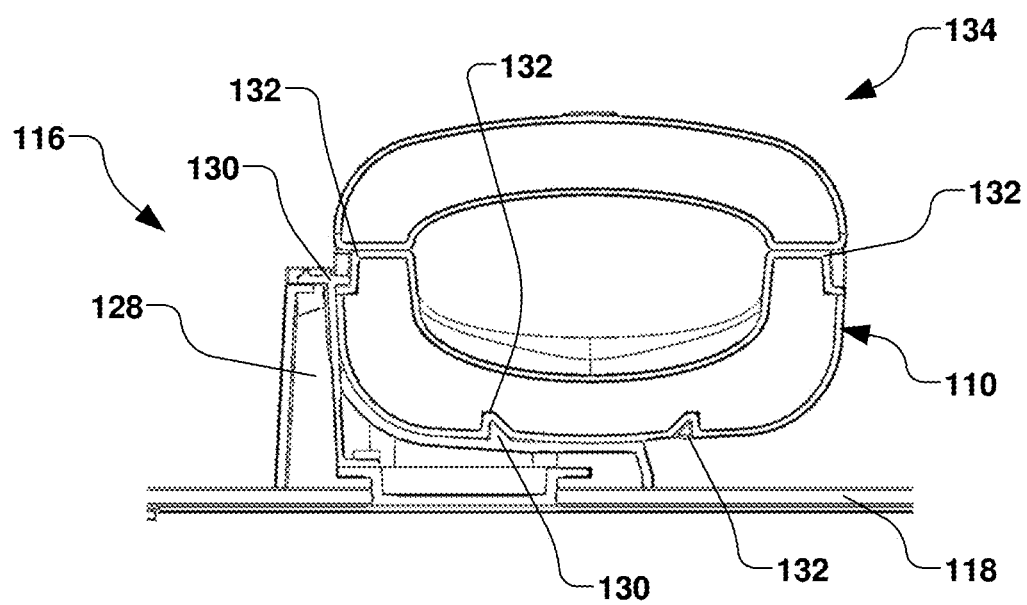
FIG. 4A is a partial side elevation view of an RF surface coil in a horizontal position in an example coil positioning system.
Figure 4B:
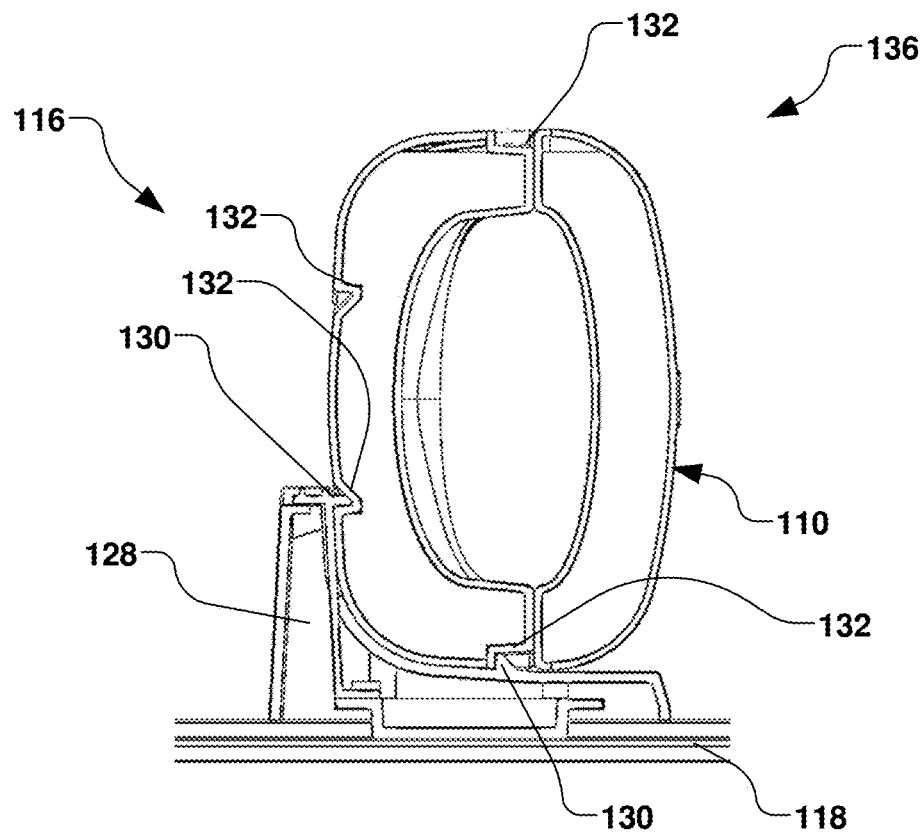
FIG. 4B is a partial side elevation view of an RF surface coil in a vertical position in an example coil positioning system.

Again, generally speaking, the coil coupling device 116 comprises a coil coupling body 128 and one or more coil engagement features 130 operatively coupled to the coil coupling body. The one or more coil engagement features 130, for example, are configured to selectively engage the RF surface coil 110 of FIGS. 1 and 2, thereby selectively coupling the RF surface coil to the coil coupling body 128 of the coil coupling device 116. For example, the one or more coil engagement features 130 are configured to selectively couple one or more coil features 132 of the RF surface coil 110 to the coil coupling body 128 in each of a horizontal position 134, as illustrated in FIG. 4A, and a vertical position 136, as illustrated in FIG. 4B, thus permitting the RF surface coil to be placed in multiple orientations for proper imaging and/or improved patient comfort.

Further, the table coupling device 114 comprises a first interface device 138, as shown in the example illustrated in FIG. 3A. The coil coupling device 116, for example, further comprises a second interface device 140 operatively coupled to the coil coupling body 128, wherein the second interface device is configured to selectively engage the first interface device 138 of the table coupling device 114. As such, the coil coupling device 116 is selectively coupled to the table coupling device 114, thereby selectively fixing the coil coupling body 128, and hence, the RF surface coil such as the RF surface coil 110 shown in FIG. 1, in a selected one of a plurality of positions with respect to the table coupling device, as will be discussed in greater detail, infra.

The coil positioning system 112 of the present disclosure, for example, is further configured to be selectively coupled to a plurality imaging tables 106 having of various architectures. While not to be interpreted as a limited example, FIGS. 5A-5D illustrate a variety of imaging tables 106 having various respective architectures 142A-142D, such as may be seen in conventional MRI systems. For example, architectures 142A-142D have one or more imaging table features 144, such as a one or more of a plurality of table widths 146A-146D and one or more of a variety of slots, holes, pins, keys, steps, or grooves 148, a curvature 150 (e.g., curved walls), two or more parallel walls 152, or other engagement features known in the art. One or more of the imaging table features 144, for example, may use one or more locating features for positioning the table coupling device 114 on the respective imaging table 106.

Figure 5A:
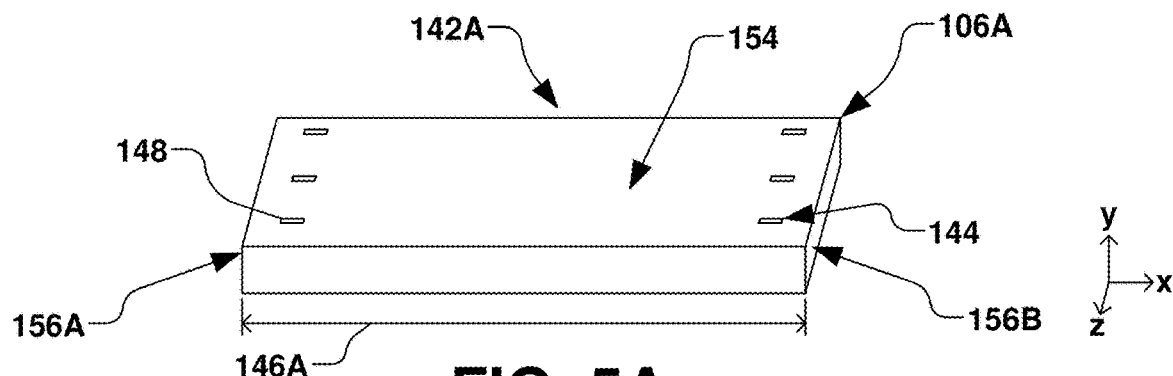
FIGS. 5A-5D are simplified perspective views of various example imaging tables.
Figure 5B:
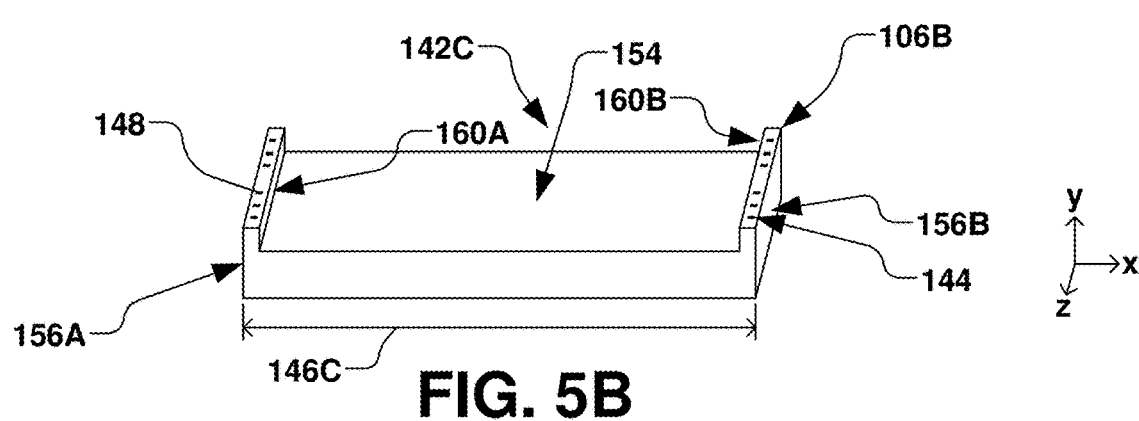
Figure 5C:
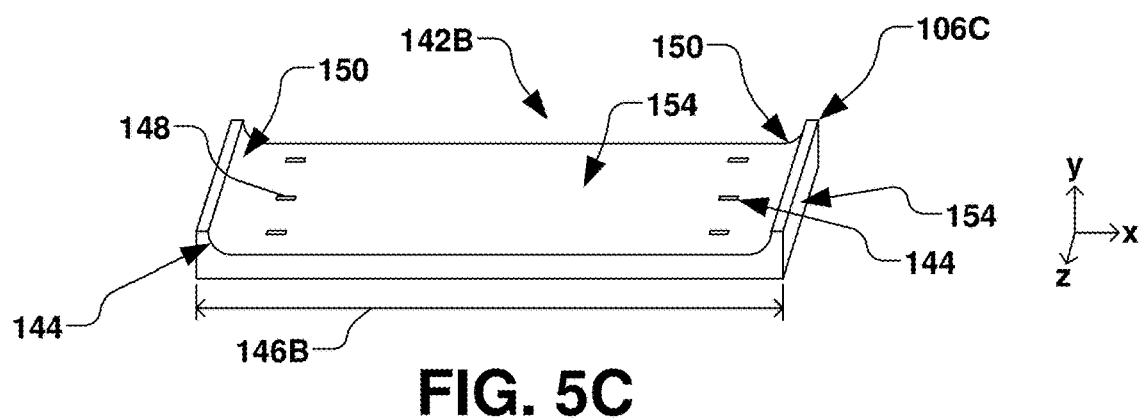
Figure 5D:
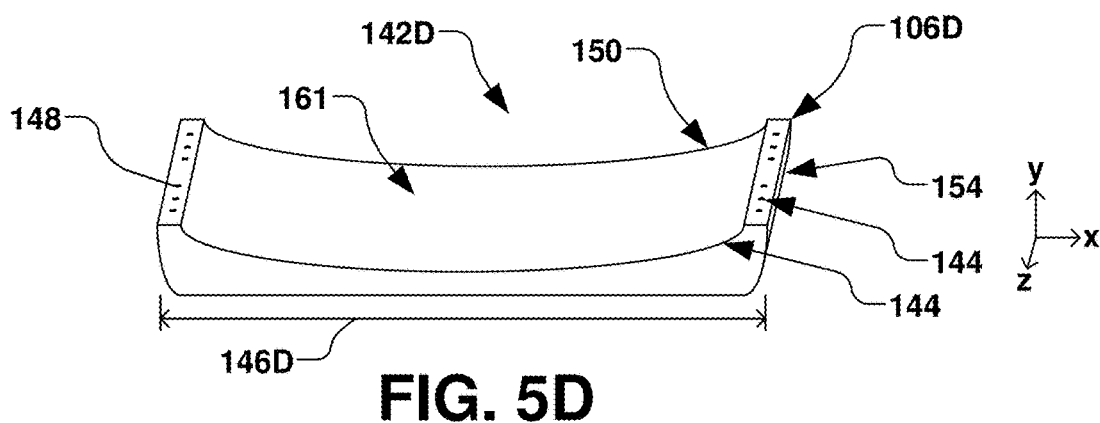

For example, the imaging table 106 of FIG. 5A comprises a generally planar surface 154 with a first table width 146A, whereby the imaging table features 144 can further comprise the one or more slots, holes, pins, keys, steps, or grooves 148 and/or opposing table sides 156A, 156B. The two opposing table sides 156A, 156B, for example, can run generally parallel to an axis 158 (e.g., the z-axis) of the bore 102 shown in FIG. 1. Further, the two opposing table sides 156A, 156B be configured as shown in FIG. 5A, or can comprise two parallel walls 160A, 160B shown in the example of FIG. 5B. FIGS. 5C and 5D, for example, illustrate various examples of the curvature 150 of the respective example imaging tables 106, whereby FIG. 5C comprises the generally planar surface 154 disposed between curved walls. The example of FIG. 5D illustrates the curvature 150 defining a generally continuous curved surface 161, whereby the one or more slots, holes, pins, keys, steps, or grooves 148 can further position or otherwise locate the table coupling device 114 of FIG. 1 on the respective imaging table 106 of FIGS. 5A-5D. Various embodiments can be adaptable to any system table that currently exists and/or those of future systems.

The present disclosure further provides for the table coupling device 114 of FIG. 1 to be mounted, mechanically coupled, or otherwise operatively coupled to any of a plurality of imaging tables 106 (e.g., the imaging tables 106A-106D of FIGS. 5A-5D) along a range of linear positions along the bore axis 158. The present disclosure further provides the table coupling device 114 of FIG. 1 as being able to rotated 90 degrees and/or 180 degrees with respect to the y-axis, wherein an engagement between the imaging table features 144 of the imaging tables 106 and the one or more first table engagement features 124 and the one or more second table engagement features 126 of FIGS. 3A-3C provides the operative coupling therebetween.

Referring again to FIGS. 3A-3C the one or more first table engagement features 124 associated with the first side 120 of the table coupling body 118, for example, are configured to selectively engage at least a first of the imaging tables 106 (e.g., at least one of the imaging tables 106A-106D of FIGS. 5A-5D) in a first orientation of the table coupling device 114 with respect to the at least one imaging table. Further, the one or more second table engagement features 126 of FIGS. 3A-3C that are associated with the second side 122 of the table coupling body 118 are configured to selectively engage at least another one of imaging tables 106 (e.g., at least another one of the imaging tables 106A-106D of FIGS. 5A-5D) in a second orientation of the table coupling device.

It is to be appreciated that table coupling body 118 of FIGS. 3A-3C in the present example is generally rectangular in shape when viewed from either of the first side 120 or the second side 122, wherein the table coupling body is generally defined by a length 162 and a width 164, as illustrated in FIG. 3A. In the present example, the length 162 of the table coupling body 118 is greater than the width 164. According to one example, the one or more first table engagement features 124 are associated with respective extents 168 of the length 162 of the table coupling body 118. The one or more first table engagement features 124, for example, can comprise one or more curved features 166 associated with the first side 120 of the table coupling body 118. As such, in the first orientation of the table coupling device 114, the one or more curved features 166 are configured to mate with the curvature 150 of one of the plurality of imaging tables, such as one or more of imaging tables 106C, 106D respectively shown in FIGS. 5C-5D. As shown in FIG. 3A, the one or more curved features 166 of the table coupling body 118, for example, are generally located at the respective extents 168 of the length 162 of the table coupling body. Thus, in the first orientation of the table coupling device 114, the first side 120 of the table coupling body 118 is configured to selectively engage at least one of the plurality of imaging tables 106 having a curvature 150 associated therewith.

According to another example, the one or more second table engagement features 126 can comprise one or more of a step, key, pin, or groove associated with the second side 122 of the table coupling body 118. As such, the one or more second table engagement features 126, for example, are configured to selectively engage the one or more imaging table features 144 associated with at least another one of the plurality of imaging tables 106 in the second orientation of the table coupling device 114. For example, a key 170 can be operatively coupled to the second side 122 of the table coupling body 118, whereby the key 170 is configured to selectively engage the one or more imaging table features 144, such as the groove 148 of imaging table 106a of FIG. 5A. In the present example, the first orientation and second orientation of the table coupling device 114 are rotated 180 degrees with respect to one another about the x-axis or z-axis shown in FIG. 1.

It is to be appreciated that the table coupling device 114 can further comprise one or more third table engagement features 172 associated with one or more of the first side 120 and second side 122 of the table coupling body 118. The one or more third table engagement features 172, for example, are associated with respective extents 174 of the width 164 of the table coupling body 118. The one or more third table engagement features 172 can be configured to selectively yet another one of the plurality of imaging tables 106 in a third orientation of the table coupling device 114, such as the imaging table 106B (e.g., a so-called "narrow table") of FIG. 5B. For example, the one or more third table engagement features 172 are generally defined by one or more sidewalls 176 of the table coupling body 118, as shown in FIG. 3C, wherein the second orientation and the third orientation described above are rotated 90 degrees with respect to one another when viewed from the first side 120 or second side 122 (e.g., rotated 90 degrees about the y-axis shown in FIG. 1). Again, it is to be appreciated that the one or more third table engagement features 172 may additionally or alternatively comprise one or more of a step, key, pin, or groove configured to selectively mate with one or more imaging table features of the third of the plurality of imaging tables.

Figure 6A:
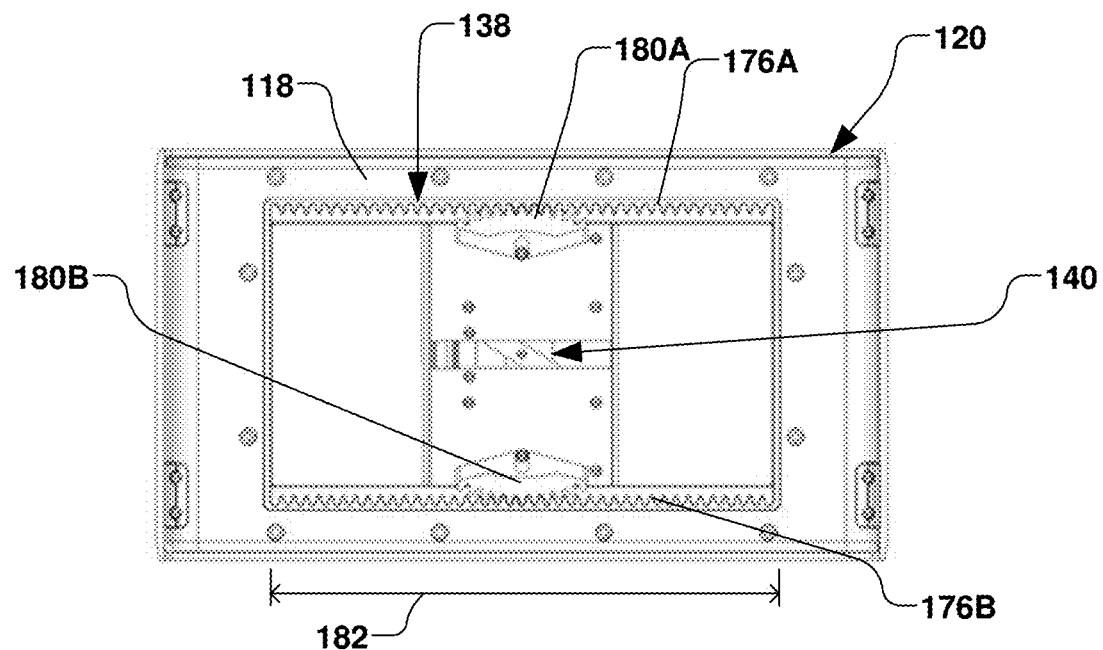
FIGS. 6A-6B are plan views of an example coil positioning system.

Referring now to FIG. 6A, and in accordance with one example of the present disclosure, a portion of the first interface device 138 of FIG. 3A is illustrated. As shown in FIG. 6A, the first interface device 138 comprises at least one rack gear 176A, 176B selectively fixedly coupled to the table coupling body 118. While two rack gears 176A, 176B are illustrated, it is to be appreciated that one rack gear 176A may be provided, whereby the rack gear 176B may be replaced with a sliding member (not shown). The second interface device 140 is further shown in FIG. 3A, whereby the second interface device comprises an engagement mechanism 178 and at least one arcuate gear 180A, 180B. Again, in a situation where only one rack gear 176A is provided, a sliding surface (not shown) may be provided to replace the arcuate gear 180B, whereby the sliding member (not shown) and sliding surface are in sliding engagement with one another.

The engagement mechanism 178, for example, is configured to selectively engage the at least one arcuate gear 180A, 180B of the second interface device 140 with the at least one rack gear 176A, 176B of the first interface device 138 in a plurality of linear and rotational positions along a length 182 of the at least one rack gear. Accordingly, based on the selective engagement of the first interface device 138 and second interface device 140, the coil coupling device 116 of FIG. 3A, for example, can selectively fix the coil coupling body 128 in each selected one of the plurality of linear positions and rotational positions with respect to the table coupling device 114 based, at least in part, on a position of the at least one arcuate gear 180A, 180B with respect to the at least one rack gear 176A, 176B.

Figure 6B:
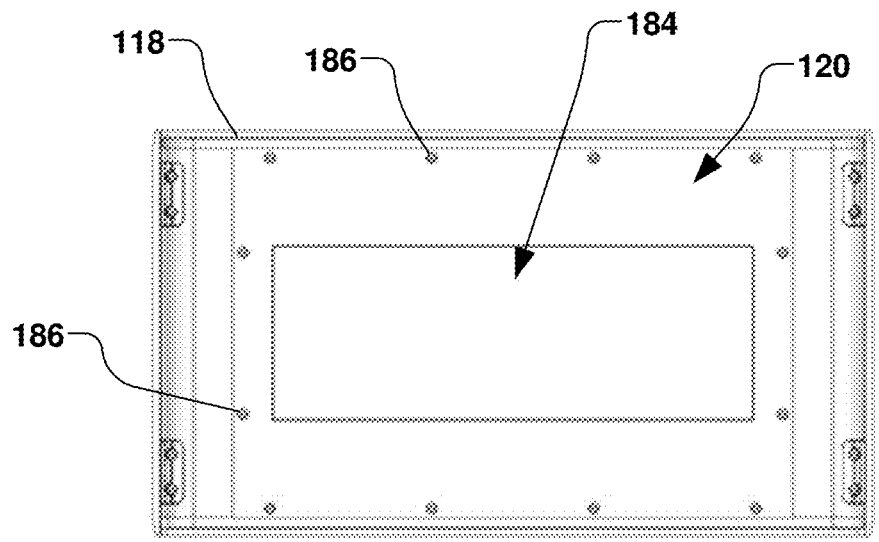
Figure 7A:
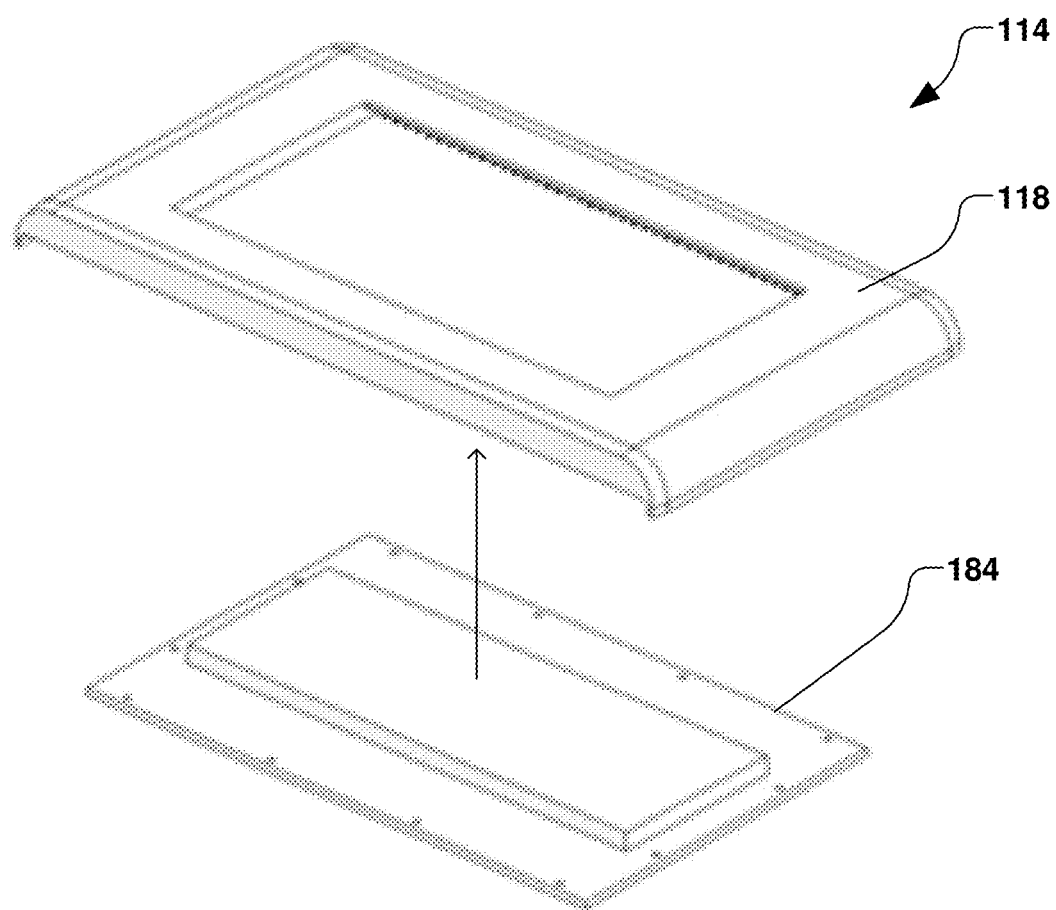
FIG. 7A is an exploded perspective view of an example table coupling device.
Figure 7B:
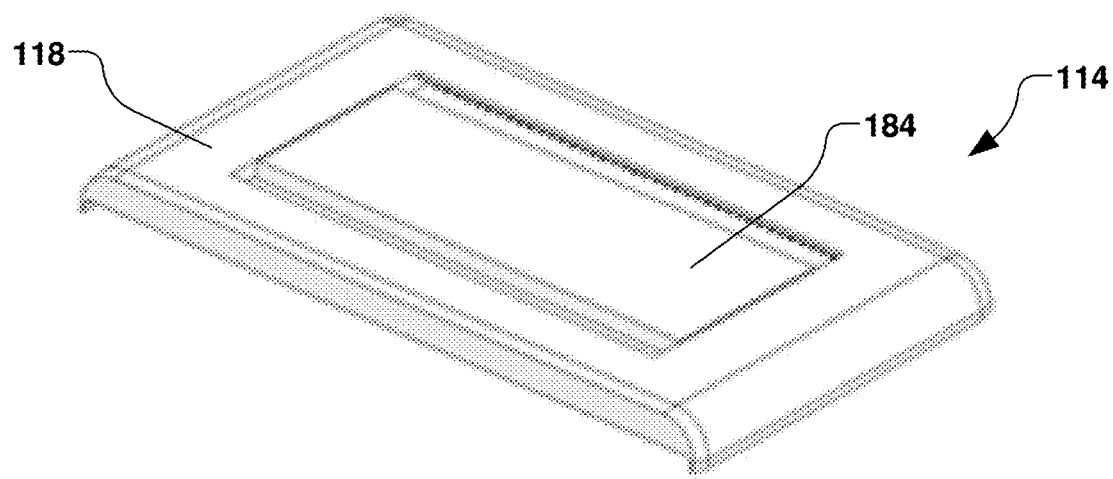
FIG. 7B is a perspective view of the example table coupling device of FIG. 7A.

According to one example, a cover plate 184 is further illustrated in FIGS. 6B and 7A-7B, wherein the cover plate is component of the table coupling device 114. The cover plate 184, for example, can be selectively coupled (e.g., via screws 186 in FIG. 6B) to the table coupling body 118 in order to generally cover and/or protect one or more of the first interface device 138 and second interface device 140 from contact with the imaging table or other objects.

Figure 8A:
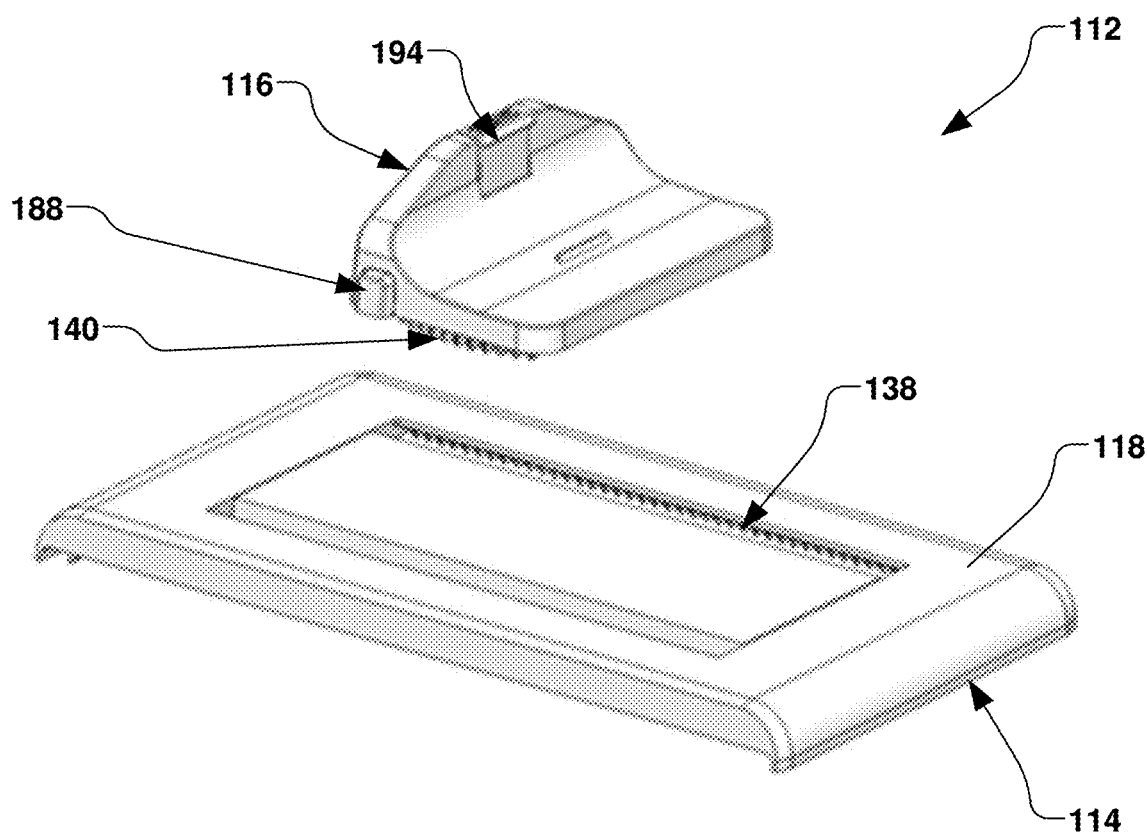
FIG. 8A is a perspective view of an example coil positioning system with a coil coupling device separated from a table coupling device.
Figure 8B:
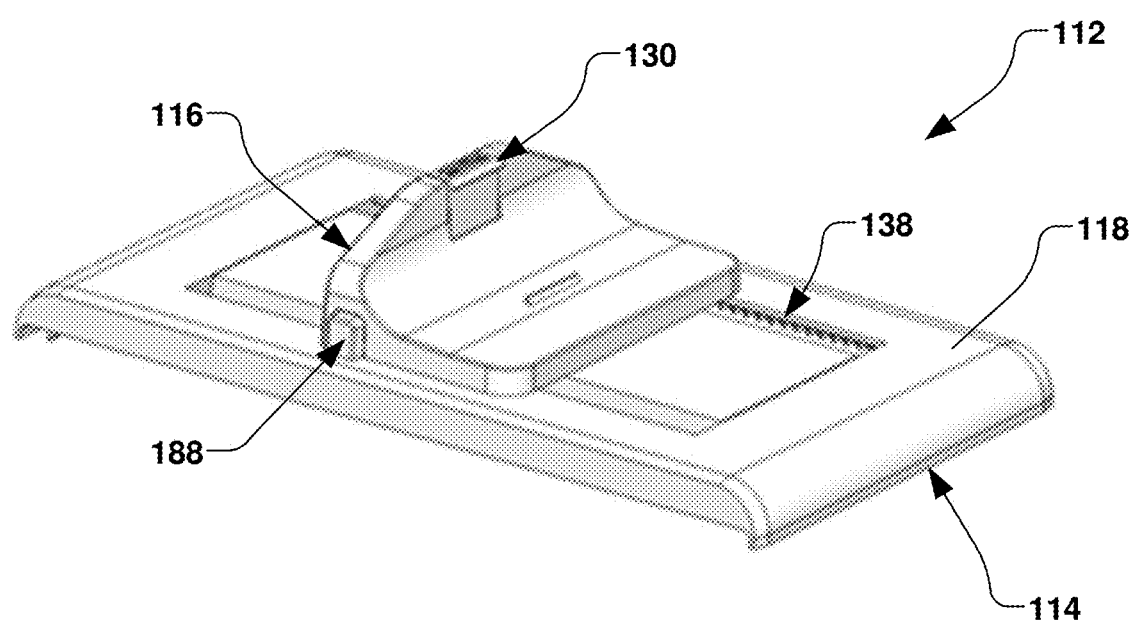
FIG. 8B is a perspective view of an example assembled coil positioning system.

As illustrated in FIGS. 8A-8B, the second interface device 140 of the coil coupling device 116, for example, is configured to selectively engage the first interface device 138 of the table coupling device 114 via an engagement mechanism 188.

As such, the coil coupling device 116 is selectively coupled to the table coupling device 114, thereby selectively fixing the coil coupling body 128, and hence, the RF surface coil (not shown in FIGS. 8A-8B) in a selected one of a plurality of positions with respect to the table coupling device.

Figure 9:
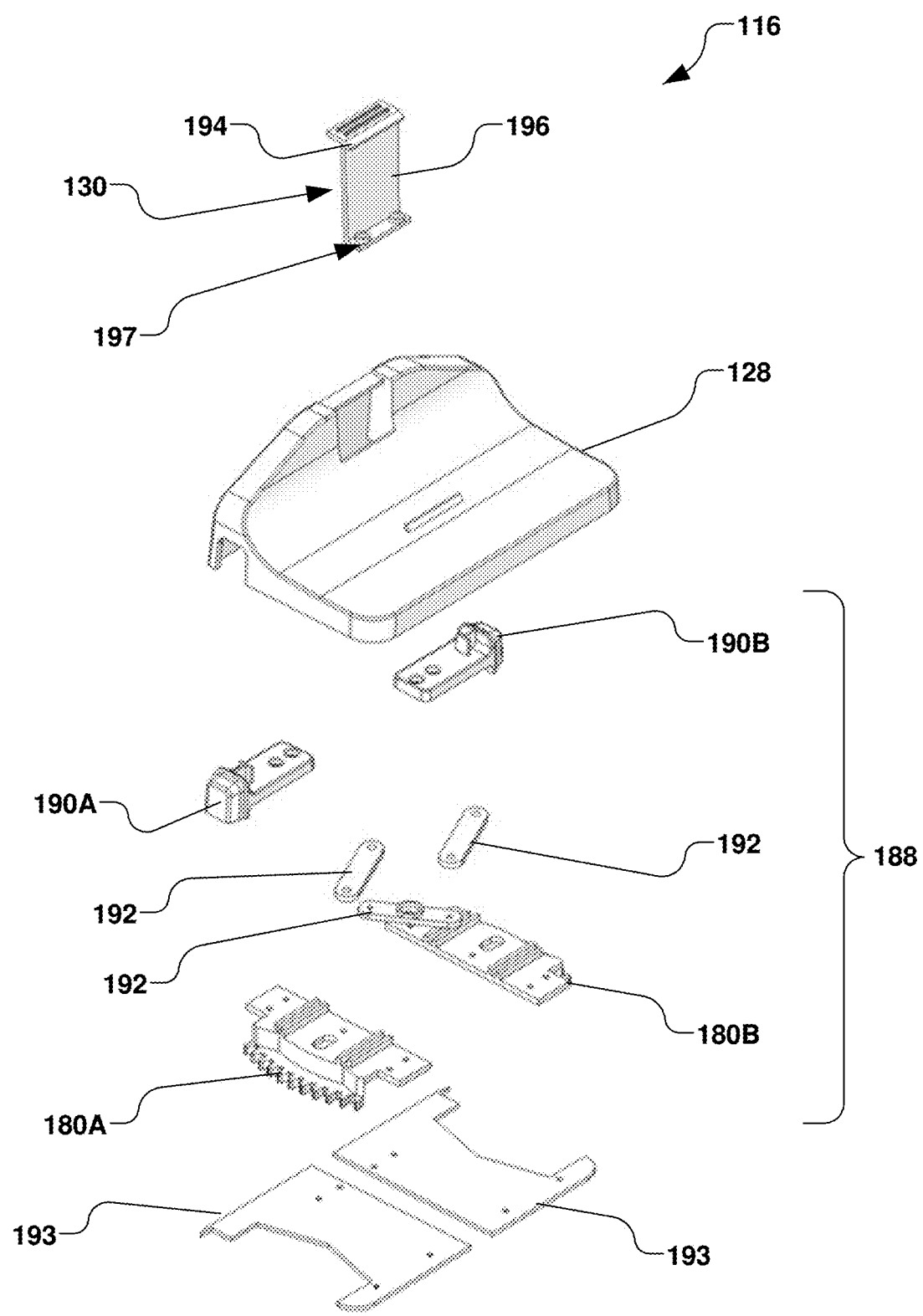
FIG. 9 is an exploded perspective view of an example coil coupling device.

FIG. 9, for example, illustrates a blown-up view of the coil coupling device 116, whereby a further understanding of the operation of the selective engagement or coupling between the coil coupling device and table coupling device 114 of FIGS. 8A-8B, for example, can be further appreciated. As illustrated in FIG. 9, the engagement mechanism 188 of the second interface device 140, for example, comprises one or more buttons 190A, 190B operatively coupled to one or more levers or linkages 192 (generally referred to hereafter as linkages). It shall be appreciated that the one or more buttons 190A, 190B may take any form of actuator member. The one or more linkages 192, for example, are further operatively coupled to the coil coupling body 128 and the one or more arcuate gears 180A, 180B. One or more covers 193 may be further provided to protect or cover the engagement mechanism 188. Accordingly, the one or more buttons 190A, 190B are configured to selectively engage the at least one arcuate gear 180A, 180B with the at least one rack gear via the one or more linkages 192, thereby selectively fixing the coil coupling body 128 in each of the plurality of positions with respect to the table coupling device discussed above based, at least in part, on a depression or actuation of the one or more buttons.

In various embodiments, the engagement mechanism 188 selectively permits the coil coupling device 116 to move relative to the table coupling device 114. For example, when the one or more buttons 190A, 190B are pressed, the coil coupling device 116 is free to translate and rotate with respect to the table coupling device. When the one or more buttons 190A, 190B are released, the one or more arcuate gears 180A, 180B are re-engaged to the respective one or more rack gears 176A, 176B of the table coupling device 114, thus generally fixing the position and orientation of the coil coupling device 116 with respect to the table coupling device.

Figure 10A:
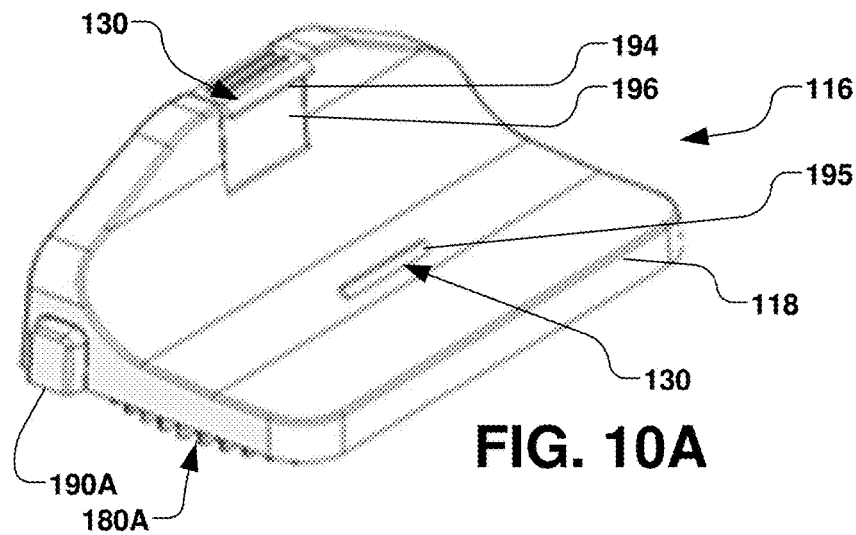
FIG. 10A is a perspective view of an example coil coupling device.
Figure 10B:
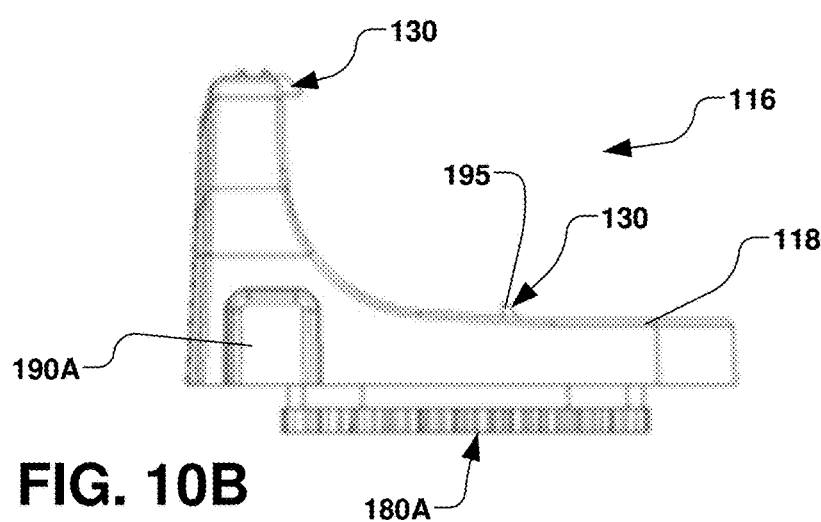
FIG. 10B is a side elevation view of the example coil coupling device of FIG. 10A.
Figure 10C:
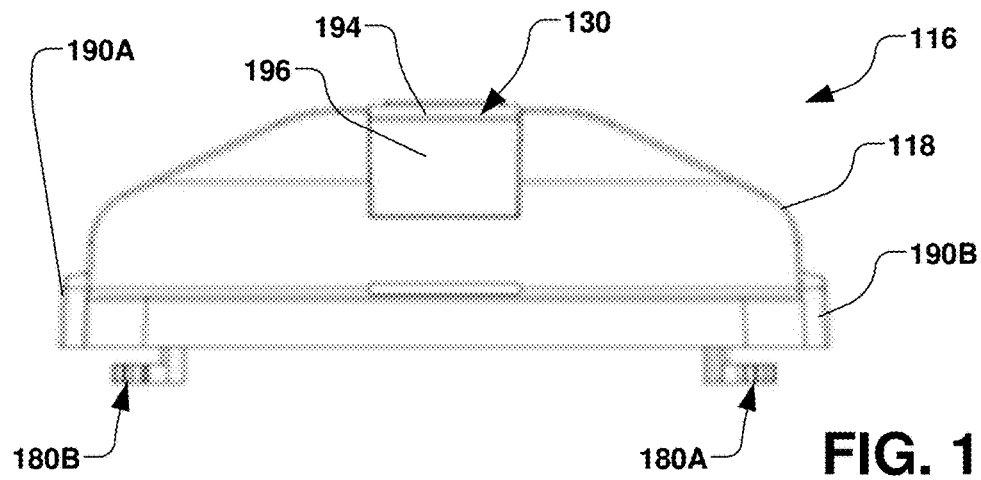
FIG. 10C is a front elevation view of the example coil coupling device of FIG. 10A.
Figure 11:
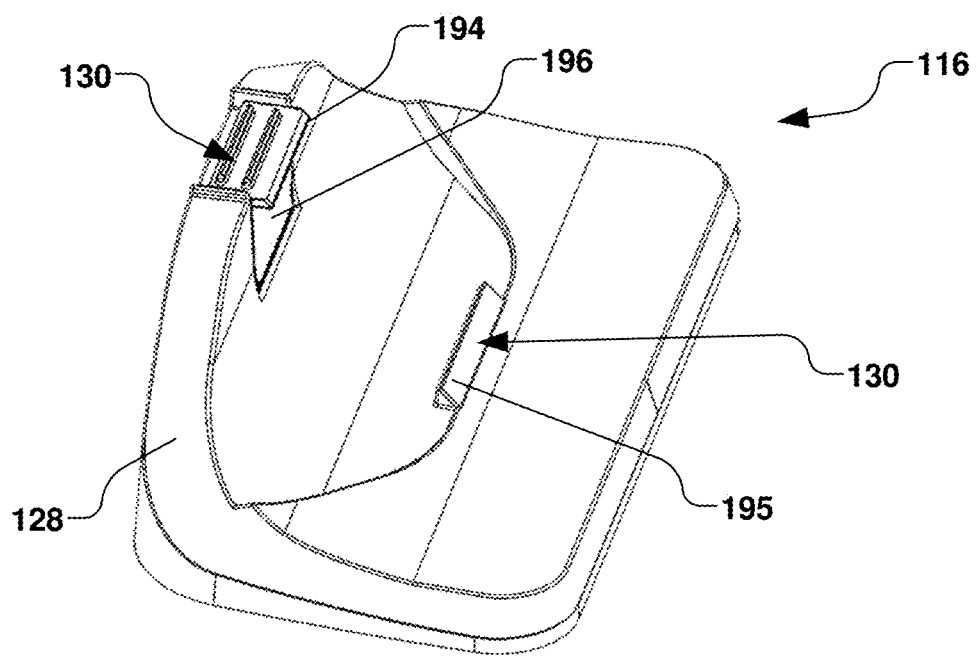
FIG. 11 is a perspective view of an example coil coupling device.

FIGS. 10A-10C illustrate various views of the coil coupling device 116 discussed above. In accordance with another example, the one or more coil engagement features 130 discussed above is further illustrated. For example, as illustrated in greater detail in FIG. 11, the one or more coil engagement features 130 comprise one or more of a dynamic coil engagement member 194 and a static coil engagement member 195. The dynamic coil engagement member 194, for example, is selectively positioned with respect to the coil coupling body 128 and configured to selectively engage at least one of the plurality of coil features 132 of the RF surface coil 110 of FIG. 12. The static coil engagement member 195 of FIG. 11, for example, is generally fixed with respect to the coil coupling body 128 and configured to selectively engage a second of the plurality of coil features 132 of the RF surface coil 110 of FIG. 12.

In accordance with another example, the dynamic coil engagement member 194 of FIGS. 10A-10C comprises a coil engagement lever 196 that is biased with respect to the coil coupling body 128. For example, as illustrated in FIG.

Figure 13:
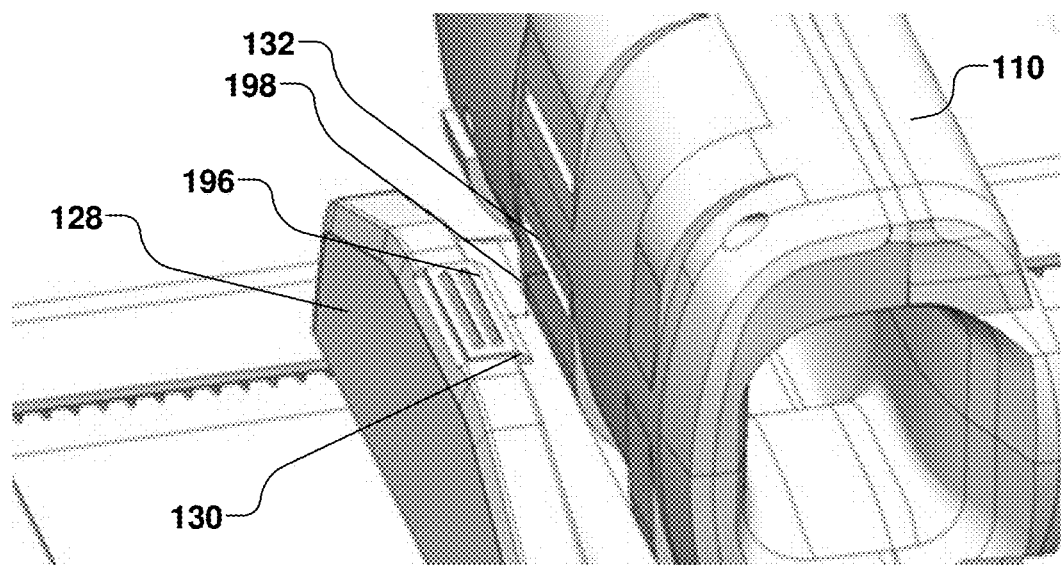
FIG. 13 is a partial perspective view of an example RF surface coil being coupled to an example coil positioning system.
Figure 14:
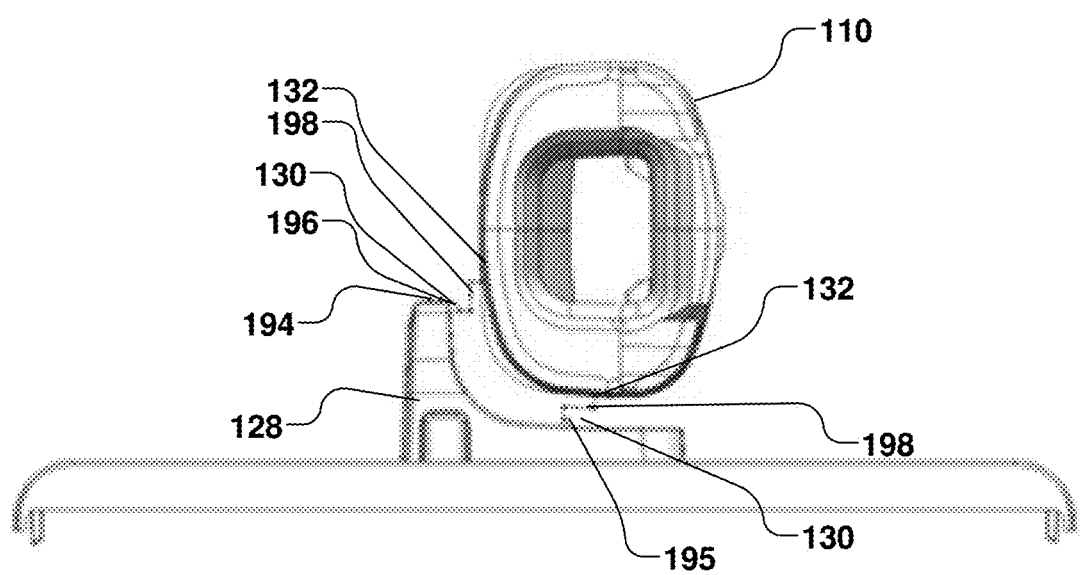
FIG. 14 is a front elevation view of an example RF surface coil being coupled to an example coil positioning system.

9, an end 197 of the coil engagement lever 196 is fixed to the coil coupling body 128, whereby the coil engagement lever is configured to rotate or pivot with respect to the end, thereof. Accordingly, the coil engagement lever 196 is configured to selectively engage the first of the plurality of coil features 132 of the RF surface coil 110, while the static coil engagement member 195 is engaged with the second of the plurality of coil features, as illustrated by lines 198 in FIGS. 13 and 14. The static coil engagement member 195, for example, can comprise one or more of a slot, groove, tab, or ridge associated with the coil coupling body 128.

The coil coupling device 116, for example, can comprise any number or configuration of dynamic coil engagement members 194 and static coil engagement members 195, such that the coil coupling device is compatible with a plurality of differing RF surface coils 110. The dynamic coil engagement members 194 and static coil engagement members 195, for example, can comprise multiple latching tabs that can be configured to fasten the plurality of coil features 132 of the RF surface coil 110 to the coil coupling device 116 in a plurality of linear and rotational positions.

Figure 15A:
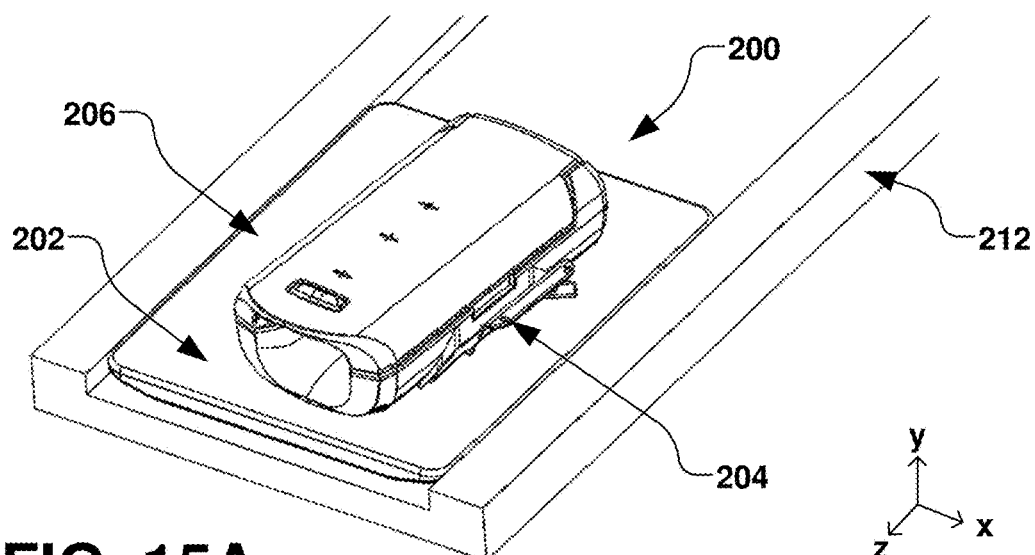
FIG. 15A is a perspective view of an example coil positioning system operatively coupled to a first imaging table.
Figure 15B:
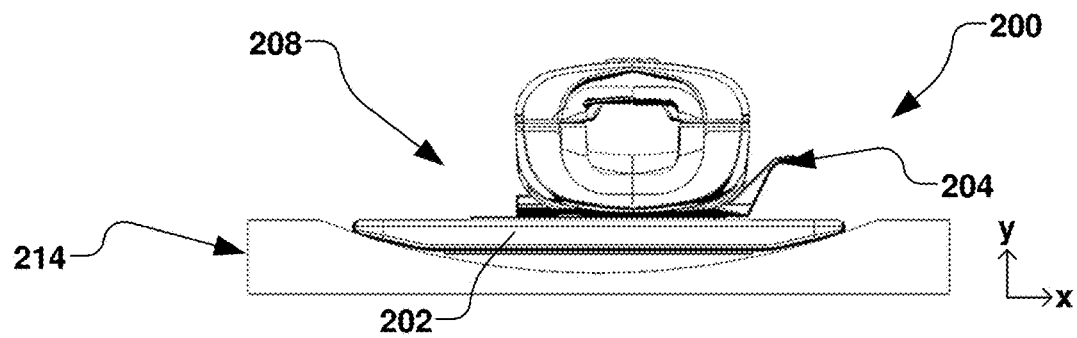
FIG. 15B is a front elevation view of an example coil positioning system operatively coupled to a second imaging table.
Figure 15C:
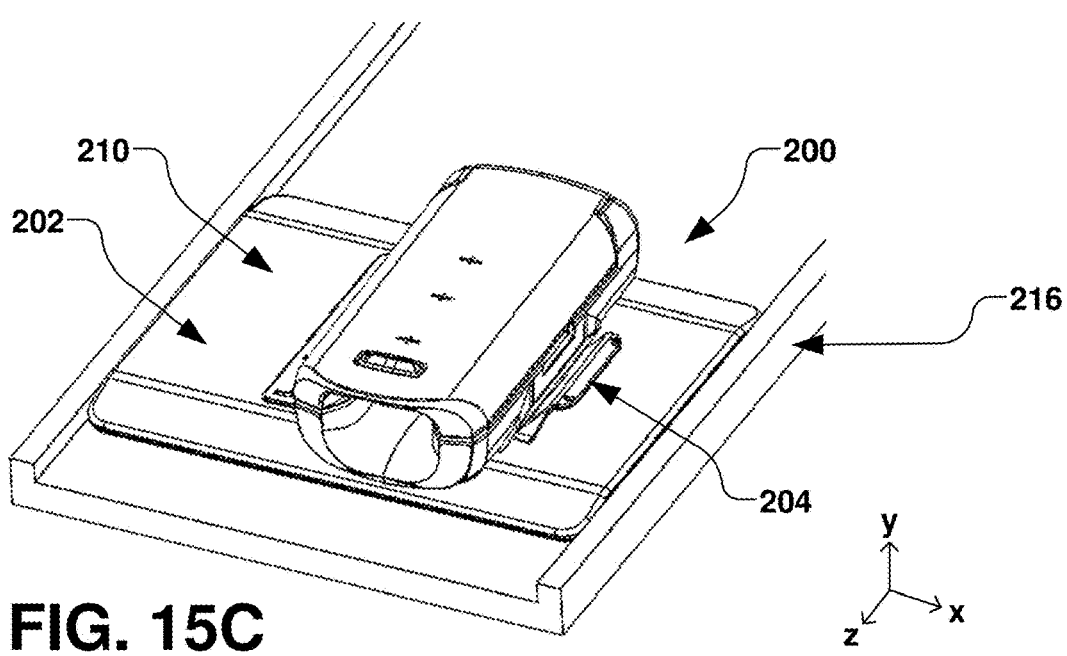
FIG. 15C is a perspective view of an example coil positioning system operatively coupled to a third imaging table.

In accordance with another example aspect of the disclosure, FIGS. 15A-15C illustrate another example of a coil positioning system 200 having a table coupling device 202 and coil coupling device 204 in a respective first orientation 206, second orientation 208, and third orientation 210 thereof, with respect to respective imaging tables 212, 214, and 216. Thus, the same coil positioning system 200, for example, can be utilized for a variety of architectures of imaging tables (and RF surface coils) in varying orientations. For example, the table coupling device 202 of FIG. 15A can be utilized in both imaging tables 212 and 214 of FIGS. 15A and 15B in the same orientation with respect to the imaging tables. However, the table coupling device 202 is rotated 180 degrees about the x-axis and the coil coupling device 204 is rotated 90 degrees about the y-axis when transitioning from the first orientation 206 and second orientation 208, to the third orientation 210.

Figure 12:
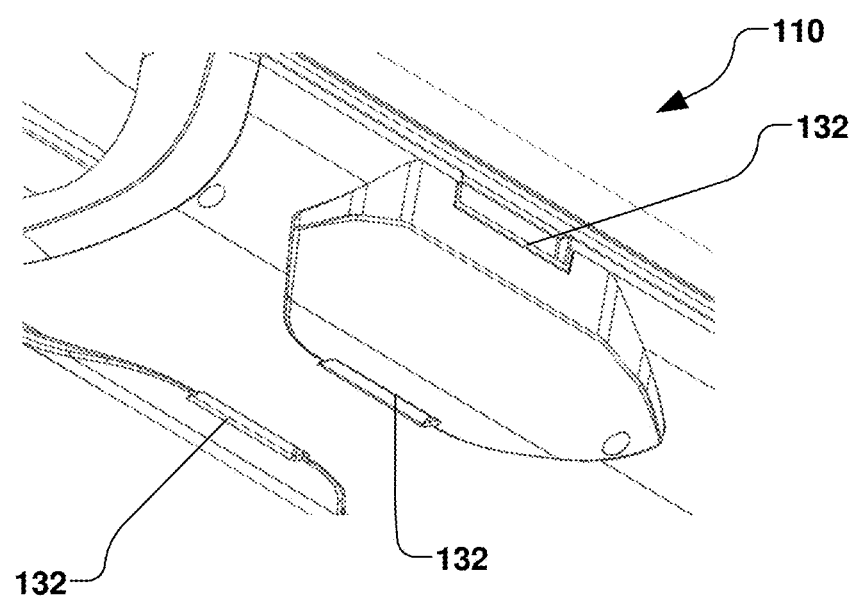
FIG. 12 is a partial perspective view of an example RF surface coil.
Figure 16A:
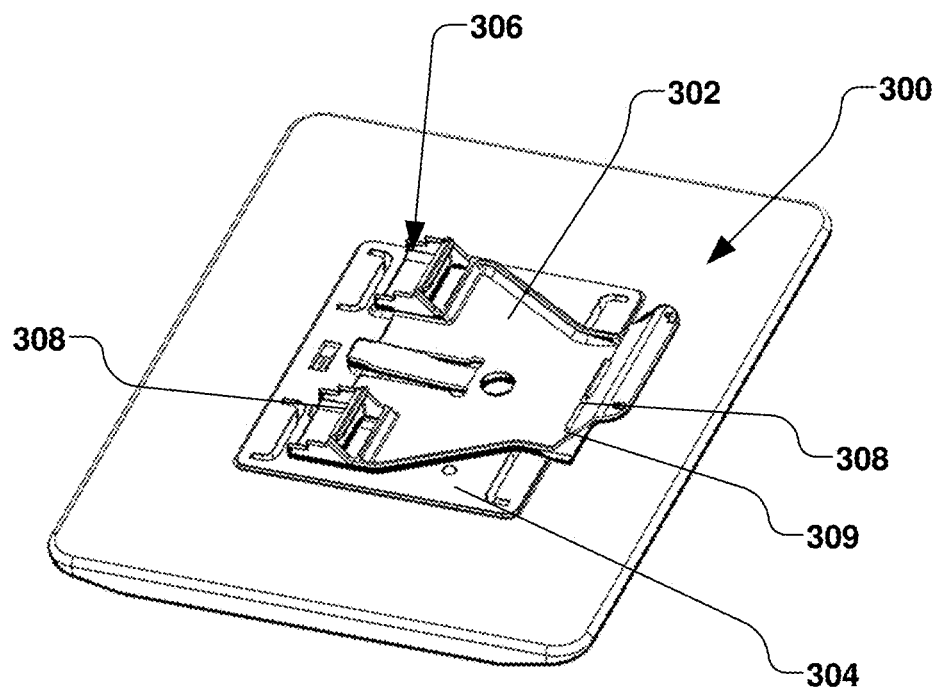
FIGS. 16A-16B are perspective views of an example coil coupling device in various positions.
Figure 16B:
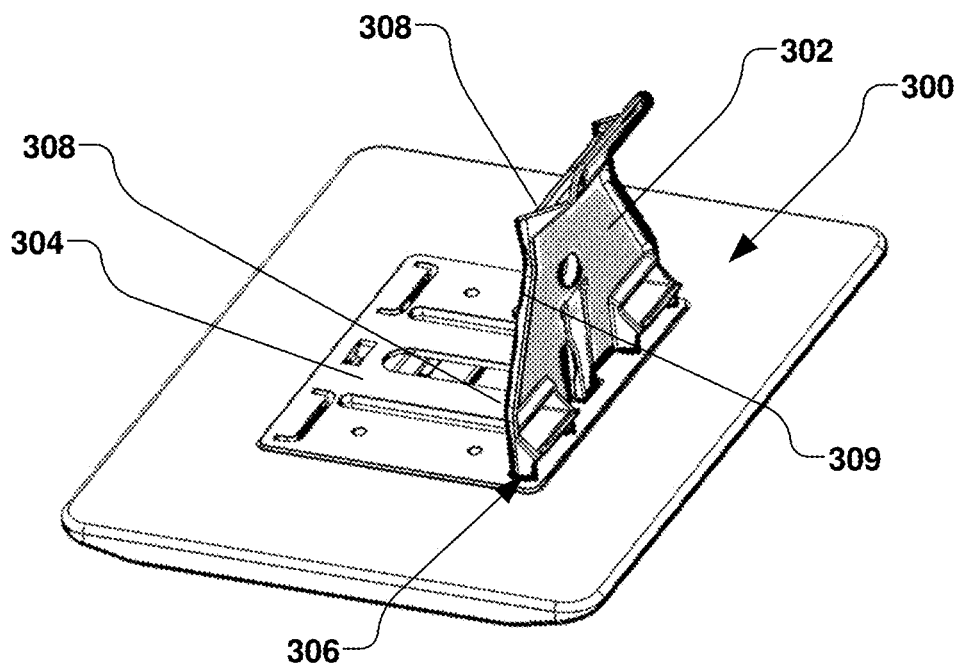

According to yet another example aspect of the disclosure, FIGS. 16A-16B illustrate a coil coupling device 300 comprising an articulated engagement member 302. The articulated engagement member 302, for example, is rotatably coupled to a coil coupling body 304 along a coil coupling axis 306, wherein one or more coil engagement features 308 are generally integral to the articulated engagement member and configured to selectively engage one or more of the plurality of coil features 132 of the RF surface coil 110, such as illustrated in FIG. 12. According to yet another example, the one or more coil engagement features 308 of FIGS. 16A-16B comprise one or more snap-fit coupling members 309 configured to selectively engage the one or more coil features 132 of the RF surface coil 110 of FIG. 12. For example, a frictional engagement between the one or more coil engagement features 308 of FIGS. 16A-16B can be established, whereby the articulated engagement member 302 is generally biased with respect to the RF surface coil to generally define the snap-fit coupling member 309.

Figure 17A:
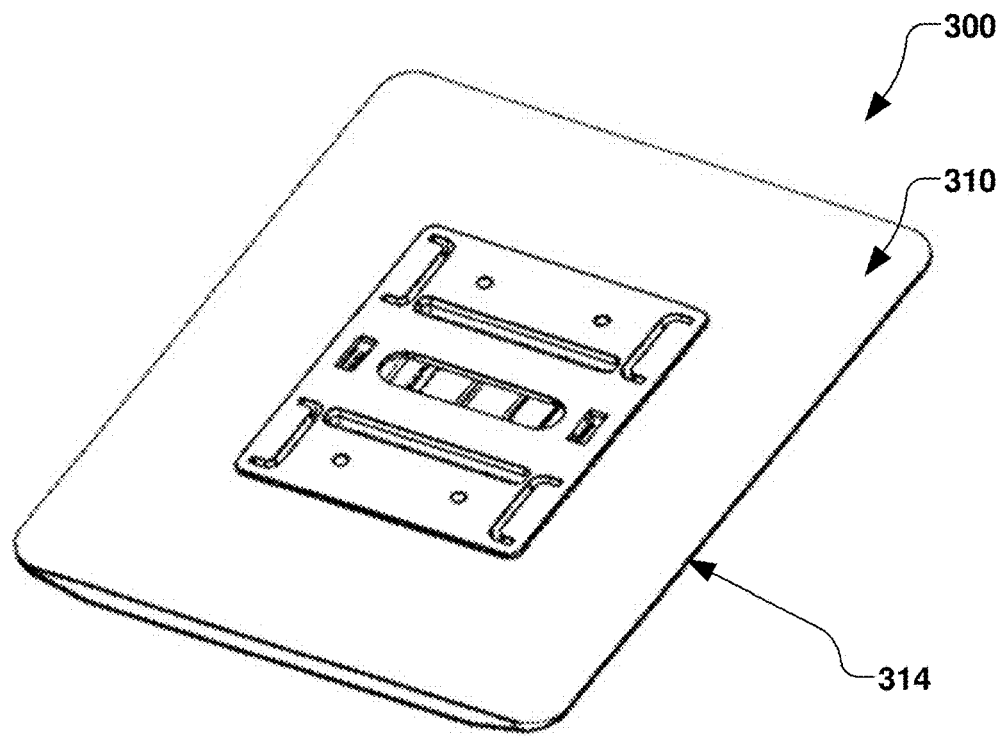
FIGS. 17A-17B are perspective views of an example coil coupling device coupled to a table coupling device in various positions.
Figure 17B:
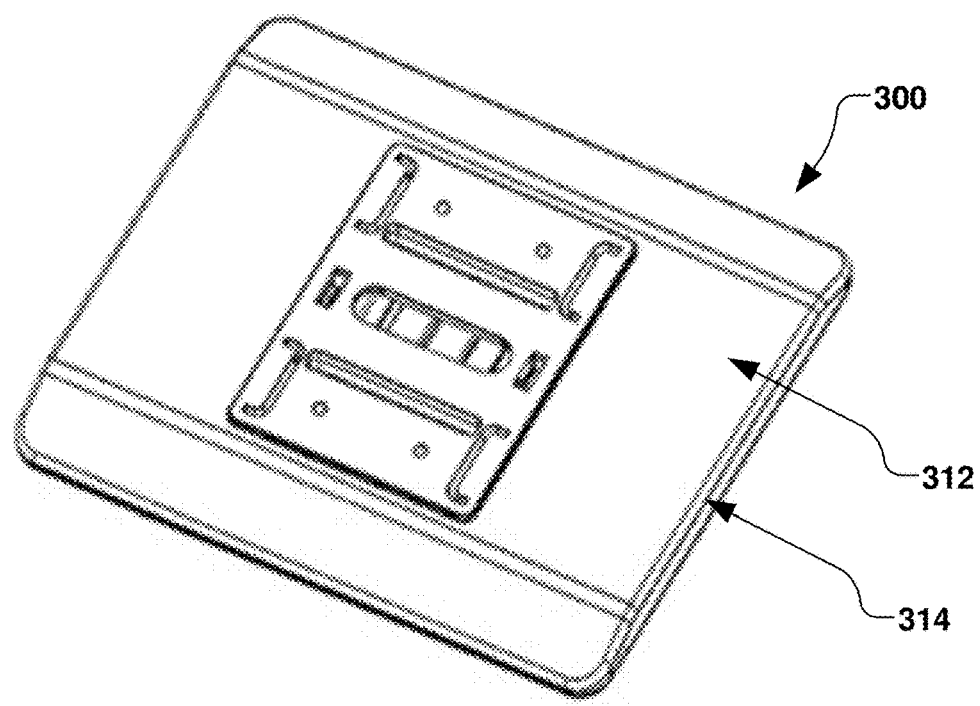
Figure 18A:
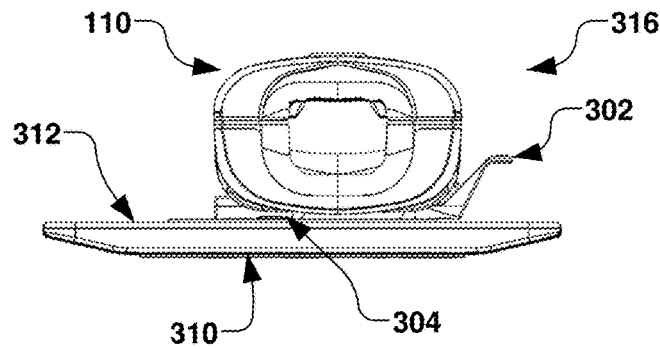
FIGS. 18A-18D are front elevation views of an example coil coupling device coupled to a table coupling device in various positions.
Figure 18B:
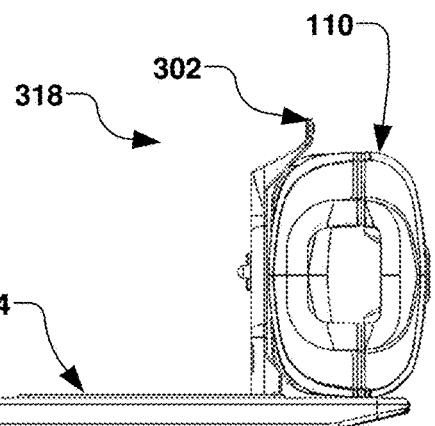
Figure 18C:
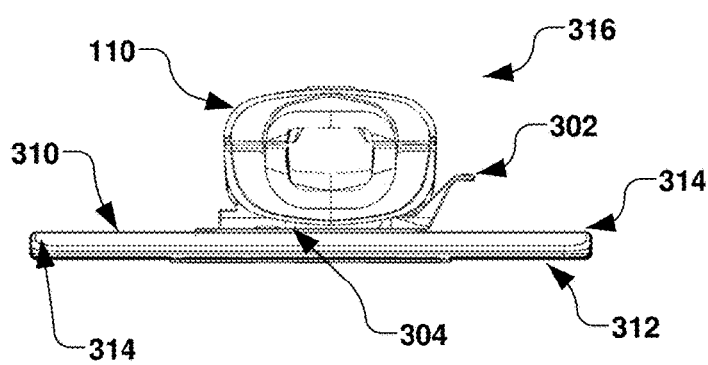
Figure 18D:
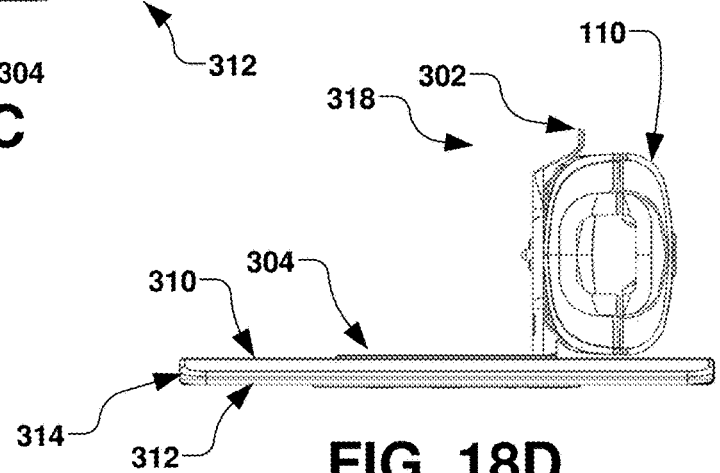
Figure 19:
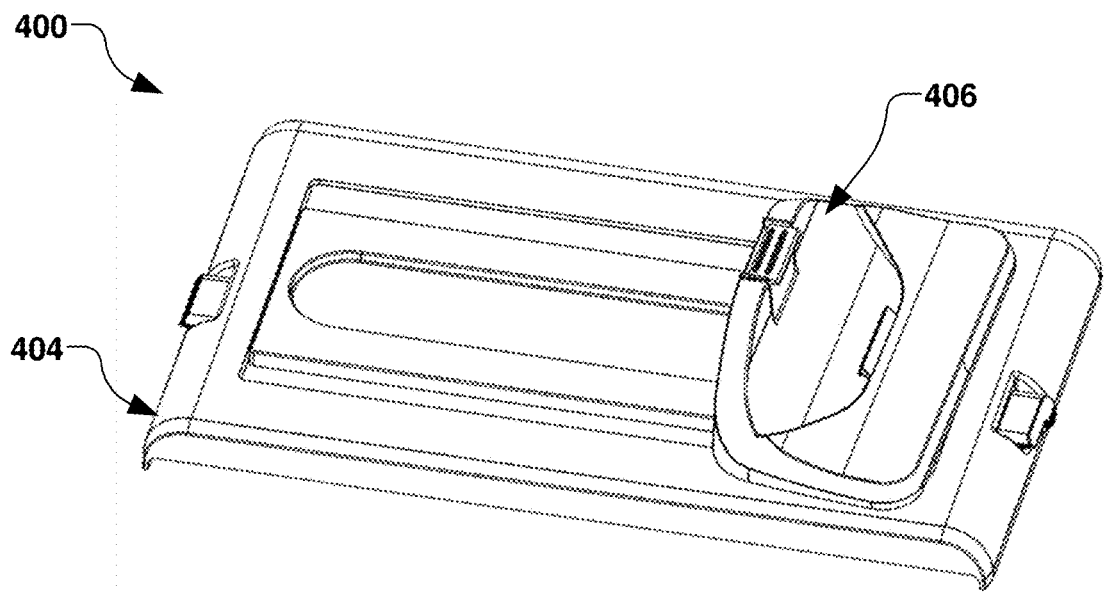
FIGS. 19-20 are perspective views of an example coil positioning system in various example positions.
Figure 20:
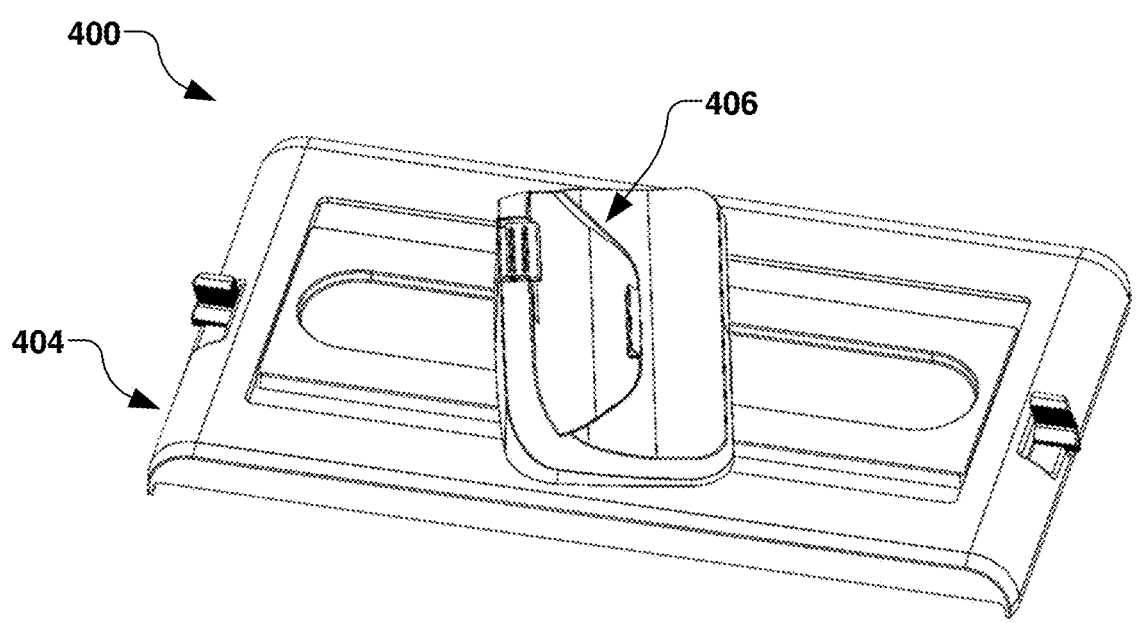
Figure 21:
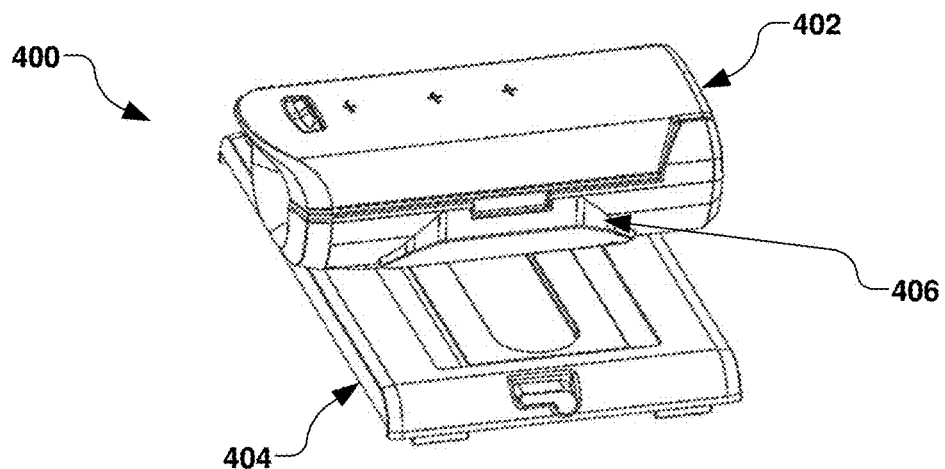
FIG. 21 is a perspective view of an example RF surface coil operatively coupled to an example coil positioning system in a horizontal orientation.
Figure 22:
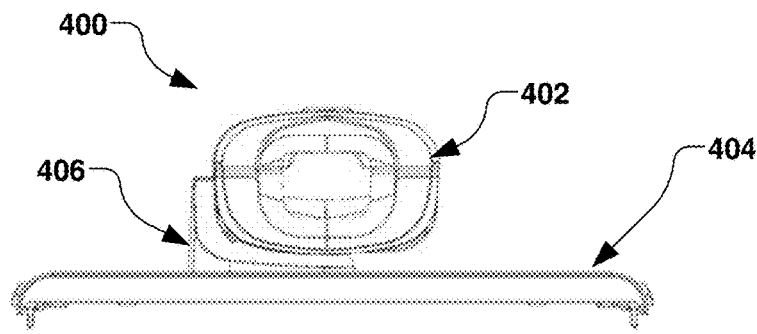
FIG. 22 is a front elevation view of an example RF surface coil operatively coupled to an example coil positioning system in a horizontal orientation.
Figure 23:
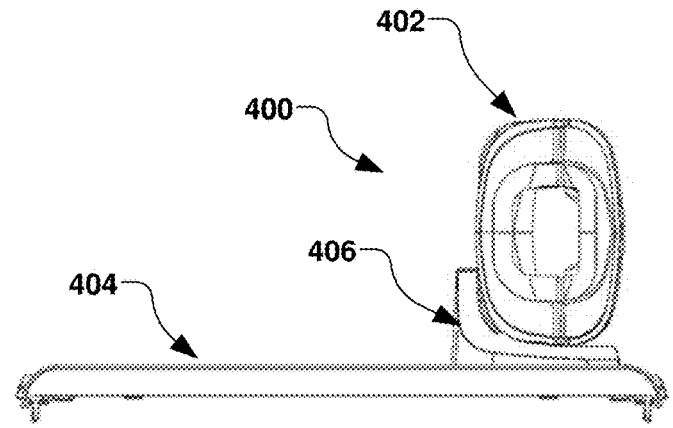
FIG. 23 is a front elevation view of an example RF surface coil operatively coupled to an example coil positioning system in a vertical orientation.
Figure 24:
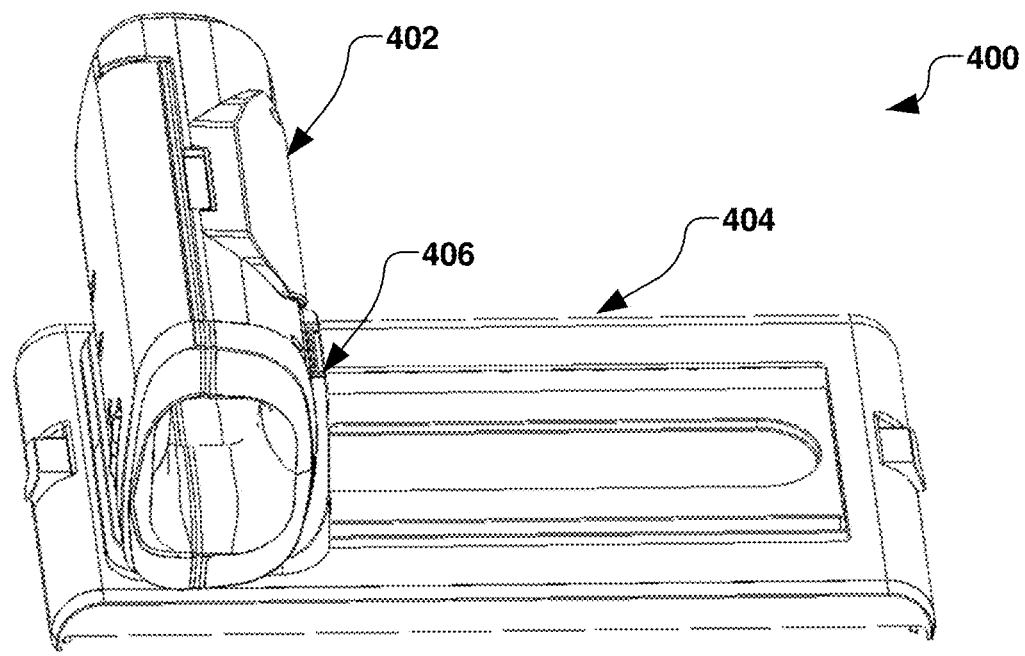
FIGS. 24-25 are perspective views of an example coil positioning system with a coil coupling device in various example linear positions.
Figure 25:
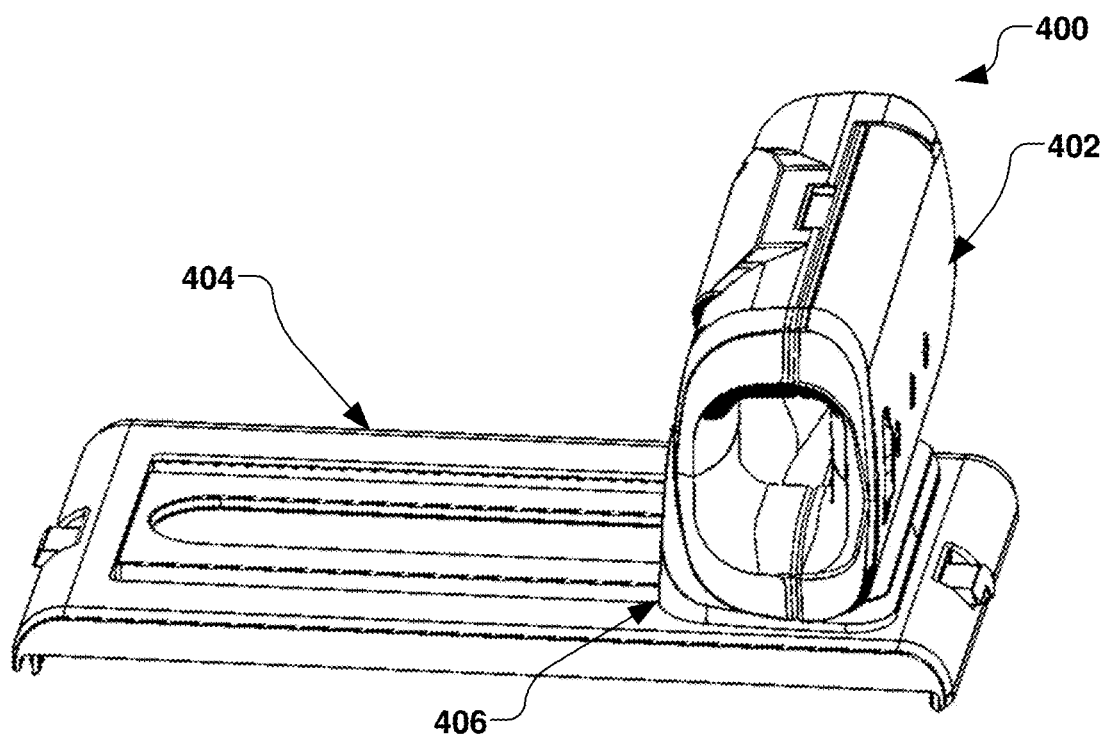
Figure 26:
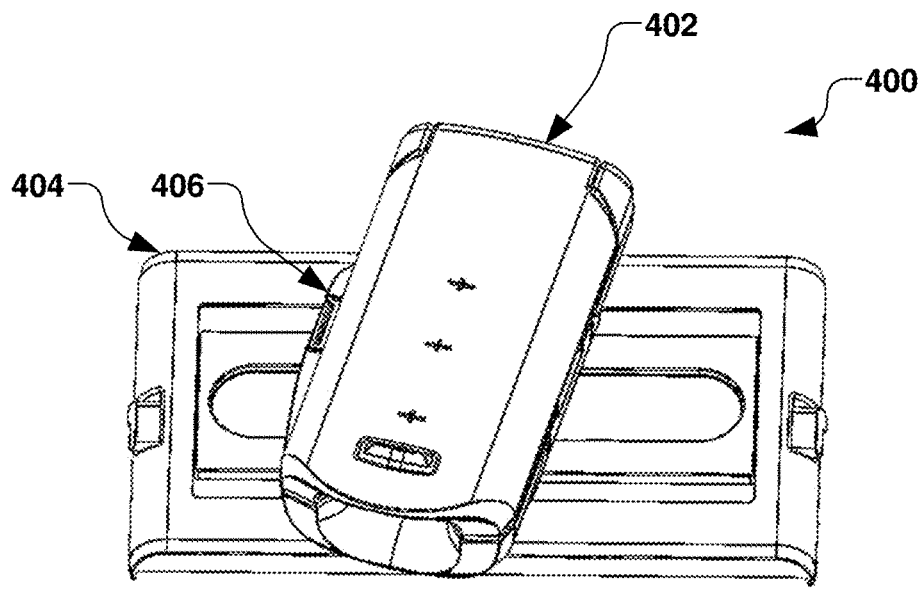
FIGS. 26-27 are perspective views of an example coil positioning system with a wrist coil in various example linear and rotational positions.
Figure 27:
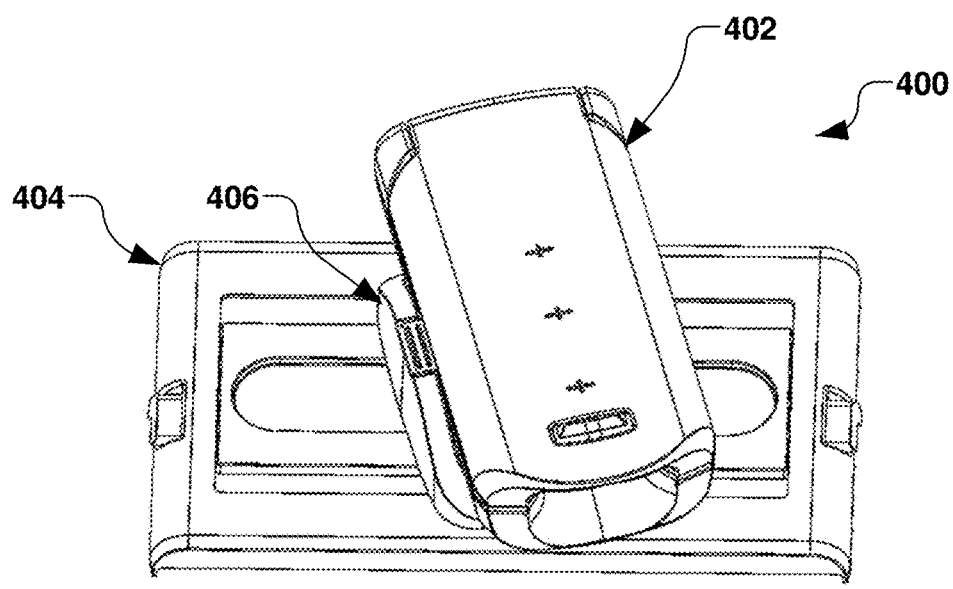
Figure 28:
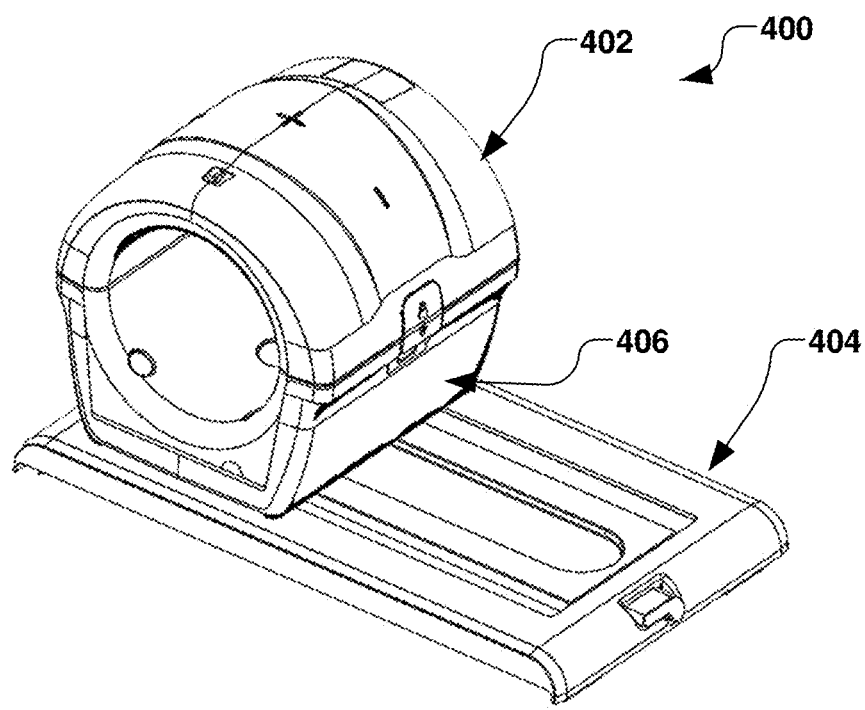
FIGS. 28-29 are perspective views of an example coil positioning system with a knee coil in various example linear positions.
Figure 29:
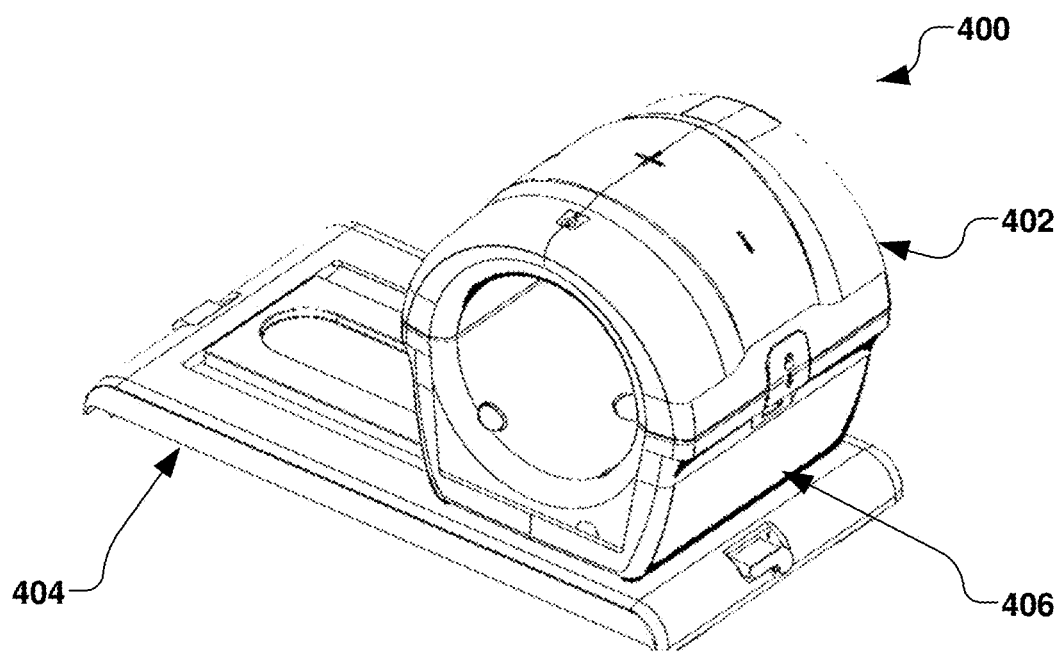

The coil coupling body 304, for example, can be selectively operatively coupled to a first side 310 and a second side 312 of a table coupling device 314, as illustrated in FIGS. 17A-17B. Further, similar to the examples discussed above, the articulated engagement member 302, for example, is configured to position the RF surface coil 110 in the both a horizontal position 316 and vertical position 318 of the RF surface coil with respect to the coil coupling body 304 is determined based on a rotational position of the articulated engagement member 302 about the coil coupling axis 306, as illustrated in the examples shown in FIGS. 18A-18D.

FIGS. 19-29 illustrate various configurations and orientations of a variety of RF surface coils 110 in various coil positioning systems 400 in accordance with various aspects of the present disclosure. In each of these systems 400, an orientation and location of various RF surface coils 402, for example, can be changed by rotating and/or flipping the table coupling device 404 and/or translating and/or rotating the coil coupling device 406 with respect to the table coupling device. As such, various anatomical RF surface coils 402 configured for specific anatomy such as a knee, foot, hand, shoulder or wrist can be located on either side of the patient and imaging table in a desired orientation for the appropriate application via the coil positioning systems 400. For example, an orientation of an RF surface coil 402 can be changed by flipping the table coupling device, as well as angled with respect to the MRI system imaging table to provide more ergonomic options to the patient and to aid in their comfort.

Various embodiments discussed herein can allow end users such as hospitals, clinics, imaging centers, and mobile imaging centers to change between multiple orientations and/or MRI machines via the coil positioning systems provided herein. Accordingly, a number of steps involved in changing orientations is reduced, as well as reducing the number of components (e.g., coil bases) to clean.

Depending on the embodiment, the table coupling device and the coil coupling device can be a single component or can be comprised of multiple components. In various embodiments, the table coupling device can be covered with materials such as a healthcare fabric, paint, polymer coating, or can be left in an uncoated state. Such coating can provide a soft touch and feel, as well as a bio-compatible contact surface. Non bio-compatible surfaces can be also used in various applications.

Figure 30:
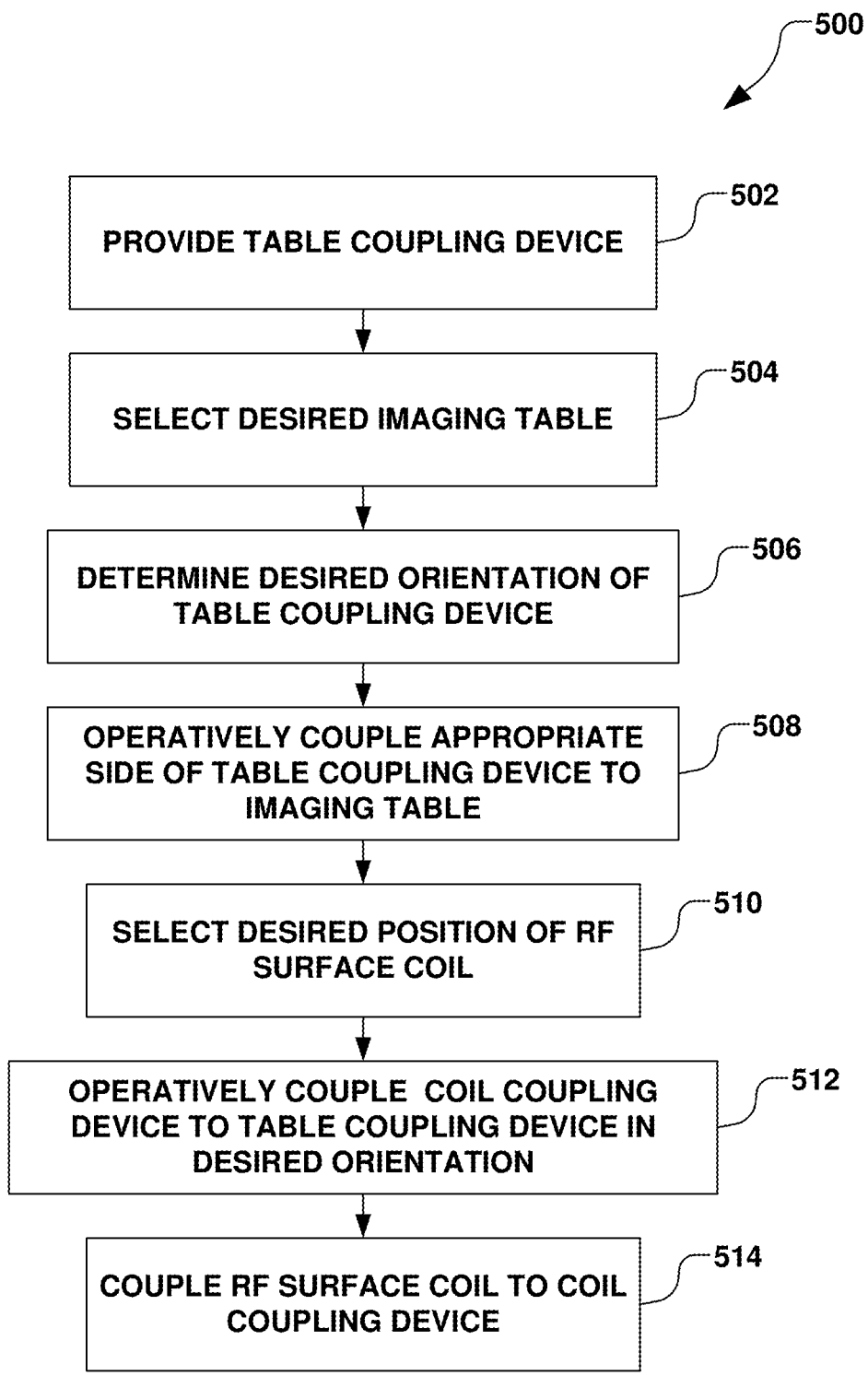
FIG. 30 is a flow chart diagram illustrating an example method for selectively coupling an RF coil in a plurality of positions to variously-configured patient tables of an MRI system.

Referring now to FIG. 30, an example method for selectively positioning an RF surface coil with respect to a plurality of imaging tables is illustrated. It should also be noted that while an exemplary method(s) are illustrated and described herein as a series of acts or events, it will be appreciated that the present disclosure is not limited by the illustrated ordering of such acts or events, as some steps may occur in different orders and/or concurrently with other steps apart from that shown and described herein, in accordance with the disclosure. In addition, not all illustrated steps may be required to implement a methodology in accordance with the present disclosure. Moreover, it will be appreciated that the methods may be implemented in association with various devices, apparatuses, or systems illustrated and described herein as well as in association with other systems not illustrated.

The method 500 of FIG. 30 initiates at 502, wherein a table coupling device is provided. The table coupling device, for example, comprises a first side, a second side, and a plurality of table engagement features. The first side and second side generally oppose one another. On one example, the first side is defined by a generally planar surface, and the second side is defined by a contoured surface having a curvature associated therewith.

In act 504, a desired one of the plurality of imaging tables is selected for a desired mounting of the table coupling device thereto. In act 506, an orientation of a table coupling device with respect to the desired one of the plurality of imaging tables is determined. The determination in act 506, for example, is based on a configuration of the desired one of the plurality of imaging tables. The orientation, for example, comprises one of the first side or second side facing the desired one of the plurality of imaging tables.

In act 508, the one of the first side or second side of the table coupling device determined in act 504 is operatively coupled to the desired one of the plurality of imaging tables in the determined orientation of the table coupling device.

In act 510, a desired one of a plurality of positions of the RF surface coil with respect to the desired one of the plurality of imaging tables is selected. The plurality of positions, for example, comprise one or more of a horizontal, vertical, rotational, and linear position of the RF surface coil with respect to the desired one of the plurality of imaging tables. Act 510 may further comprise selecting one of a plurality of RF surface coils based on a desired anatomy to be imaged.

In act 512, a coil coupling device is operatively coupled to the table coupling device in an orientation that is based, at least in part, on the one of the plurality of positions of the RF surface coil that is selected in act 510. The orientation of the coil coupling device may comprise one or more of a linear position and a rotational position of the coil coupling device with respect to the table coupling device.

In act 514, the RF surface coil is operatively coupled to the coil coupling device in the desired one of the plurality of positions.

Although the disclosure has been shown and described with respect to a certain applications and implementations, it will be appreciated that equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (i.e., that is functionally equivalent), even though not structurally equivalent to the disclosed structure, which performs the function in the herein illustrated exemplary implementations of the disclosure.

In addition, while a particular feature of the disclosure may have been disclosed with respect to only one of several implementations, such feature may be combined with one or more other features of the other implementations as may be desired and advantageous for any given or particular application. Furthermore, to the extent that the terms "includes", "including", "has", "having", and variants thereof are used in either the detailed description or the claims, these terms are intended to be inclusive in a manner similar to the term "comprising".

What is claimed is:

1. A coil positioning system for selective positioning of an RF surface coil with respect to a plurality of imaging tables, the coil positioning system comprising:
    a table coupling device comprising:
    a table coupling body having a first side and a second side generally opposite the first side;
    one or more first table engagement features associated with the first side of the table coupling body, wherein the one or more first table engagement features are configured to selectively engage a first imaging table of the plurality of imaging tables in a first orientation of the table coupling device;
    one or more second table engagement features associated with the second side of the table coupling body, wherein the one or more second table engagement features are configured to selectively engage a second imaging table of the plurality of imaging tables in a second orientation of the table coupling device; and
    a first interface device; and
    a coil coupling device comprising:
    a coil coupling body;
    a second interface device operatively coupled to the coil coupling body and configured to selectively engage the first interface device, thereby selectively coupling the coil coupling device to the table coupling device and fixing the coil coupling body in a selected one of a plurality of positions with respect to the table coupling device; and
    one or more coil engagement features operatively coupled to the coil coupling body and configured to selectively engage the RF surface coil in each of a horizontal position and a vertical position of the RF surface coil with respect to the coil coupling body, thereby selectively coupling the RF surface coil to the coil coupling device.

2. The coil positioning system of claim 1, wherein the first interface device comprises at least one rack gear fixedly coupled to the table coupling body, and wherein the second interface device comprises an engagement mechanism and at least one arcuate gear, wherein the engagement mechanism is configured to selectively engage the at least one arcuate gear with the at least one rack gear, thereby selectively fixing the coil coupling body in each selected one of the plurality of positions with respect to the table coupling device based, at least in part, on a position of the at least one arcuate gear with respect to the at least one rack gear.

3. The coil positioning system of claim 2, wherein at least a portion of the plurality of positions of the coil coupling body with respect to the table coupling device comprise a plurality of linear positions of the coil coupling body along a length of the table coupling device.

4. The coil positioning system of claim 2, wherein at least a portion of the plurality of positions of the coil coupling body with respect to the table coupling device comprise a plurality of rotational positions of the coil coupling body with respect to the table coupling device.

5. The coil positioning system of claim 2, wherein the plurality of positions of the coil coupling body with respect to the table coupling device comprise one or more of a plurality of linear positions of the coil coupling body along a length of the table coupling device and a plurality of rotational positions of the coil coupling body with respect to the table coupling device.

6. The coil positioning system of claim 2, wherein the engagement mechanism comprises one or more buttons operatively coupled to one or more linkages, wherein the one or more linkages are operatively coupled to the coil coupling body and the at least one arcuate gear, and wherein the one or more buttons are configured to selectively engage the at least one arcuate gear with the at least one rack gear via the one or more linkages, thereby selectively fixing the coil coupling body in each of the plurality of positions with respect to the table coupling device based, at least in part, on a depression of the one or more buttons.

7. The coil positioning system of claim 1, wherein the table coupling body is generally rectangular and defined by a length and a width when viewed from the first side, wherein the length is greater than the width, wherein the one or more first table engagement features comprise one or more curved features associated with the first side of the table coupling body, and wherein the one or more curved features are configured to mate with a curvature of the first imaging table of the plurality of imaging tables in the first orientation of the table coupling device.

8. The coil positioning system of claim 7, wherein the one or more curved features of the table coupling body are generally located at one or more respective extents of the length of the table coupling body, and wherein the first side of the table coupling body selectively engages the first imaging table of the plurality of imaging tables in the first orientation of the table coupling device.

9. The coil positioning system of claim 8, wherein the one or more second table engagement features comprise one or more of a step, key, pin, or groove associated with the second side of the table coupling body and configured to selectively engage one or more imaging table features associated with the second imaging table of the plurality of imaging tables in the second orientation of the table coupling device.

10. The coil positioning system of claim 7, wherein the table coupling device further comprises one or more third table engagement features associated with the second side of the table coupling body, wherein the one or more third table engagement features are configured to selectively engage a third imaging table of the plurality of imaging tables in a third orientation of the table coupling device, wherein the second orientation and the third orientation are rotated 90 degrees with respect to one another when viewed from the second side.

11. The coil positioning system of claim 10, wherein the one or more second table engagement features and one or more third table engagement features comprise one or more of a step, key, pin, or groove configured to selectively mate with one or more imaging table features of the second of the plurality of imaging tables and the third imaging table of the plurality of imaging tables.

12. The coil positioning system of claim 1, wherein the one or more coil engagement features comprise a dynamic coil engagement member, wherein the dynamic coil engagement member is selectively positionable with respect to the coil coupling body and configured to selectively engage a first of a plurality of coil features of the RF surface coil.

13. The coil positioning system of claim 12, wherein the one or more coil engagement features further comprise a static coil engagement member that is fixed with respect to the coil coupling body and configured to selectively engage a second of the plurality of coil features of the RF surface coil.

14. The coil positioning system of claim 13, wherein the dynamic coil engagement member comprises a coil engagement lever that is biased with respect to the coil coupling body and configured to selectively engage the first of the plurality of coil features of the RF surface coil, and wherein the static coil engagement member comprises one or more of a slot, groove, tab, or ridge associated with the coil coupling body.

15. The coil positioning system of claim 1, wherein the coil coupling device further comprises an articulated engagement member, wherein the articulated engagement member is rotatably coupled to the coil coupling body along a coil coupling axis, wherein the one or more coil engagement features are integral to the articulated engagement member, and wherein the horizontal position and vertical position of the RF surface coil with respect to the coil coupling body is determined based on a rotational position of the articulated engagement member about the coil coupling axis.

16. The coil positioning system of claim 15, wherein the one or more coil engagement features comprise one or more snap-fit coupling members configured to selectively engage one or more coil features of the RF surface coil.

17. A system for selective positioning of an RF surface coil with respect to a plurality of imaging tables, the system comprising:
a table coupling device comprising a first side, a second side, and a plurality of table engagement features, wherein the first side and second side generally oppose one another, wherein the first side is defined by a generally planar surface configured to generally mate with a first imaging table of the plurality of imaging tables, and wherein the second side is defined by a contoured surface having a curvature associated therewith configured to mate with a second imaging table of the plurality of imaging tables; and
a coil coupling device configured to selectively couple each of the first side and second side of the table coupling device in a respective first configuration and second configuration, wherein the coil coupling device is configured to selectively rotate about a rotation axis extending generally perpendicularly to the first side, wherein the coil coupling device is further configured to selectively translate along an translation axis extending generally perpendicularly to the rotation axis, wherein the coil coupling device comprises one or more coil engagement features configured to selectively engage the RF surface coil in each of a horizontal position and a vertical position of the RF surface coil with respect to the table coupling device.

18. The system of claim 17, wherein the table coupling device comprises at least one rack gear, and wherein the coil coupling device comprises an engagement mechanism and at least one arcuate gear, wherein the engagement mechanism is configured to selectively engage the at least one arcuate gear with the at least one rack gear, thereby selectively fixing the coil coupling device in each of a selected one of a plurality of positions with respect to the table coupling device based, at least in part, on a position of the at least one arcuate gear with respect to the at least one rack gear.

19. The system of claim 17, wherein the one or more coil engagement features comprise a dynamic coil engagement member, wherein the dynamic coil engagement member is selectively positionable and configured to selectively engage one or more coil features of the RF surface coil.

20. A method for selectively positioning an RF surface coil with respect to a plurality of imaging tables, the method comprising:
providing a table coupling device comprising a first side, a second side, and a plurality of table engagement features, wherein the first side and second side generally oppose one another, wherein the first side is defined by a generally planar surface, and wherein the second side is defined by a contoured surface having a curvature associated therewith;
selecting one of the plurality of imaging tables for a desired mounting of the table coupling device thereto;
determining an orientation of a table coupling device with respect to the one of the plurality of imaging tables, wherein the determination of the orientation of the table coupling device is based on a configuration of the one of the plurality of imaging tables, and wherein the orientation comprises one of the first side or second side facing the one of the plurality of imaging tables;
operatively coupling the one of the first side or second side of the table coupling device to the one of the plurality of imaging tables in the determined orientation of the table coupling device;

selecting one of a plurality of positions of the RF surface coil with respect to the one of the plurality of imaging tables, wherein the plurality of positions comprise one or more of a horizontal, vertical, rotational, and linear position of the RF surface coil with respect to the one of the plurality of imaging tables;

operatively coupling a coil coupling device to the table coupling device, wherein an orientation of the coil coupling device with respect to the table coupling device is based, at least in part, on the selected one of the plurality of positions of the RF surface coil with respect to the one of the plurality of imaging tables; and operatively coupling the RF surface coil to the coil coupling device in the one of the plurality of positions.

\* \* \* \* \*